(12) United States Patent
Verschuren et al.

(10) Patent No.: US 11,747,738 B2
(45) Date of Patent: Sep. 5, 2023

(54) DETERMINING THE COMBINATION OF PATTERNS TO BE APPLIED TO A SUBSTRATE IN A LITHOGRAPHY STEP

(71) Applicant: ASML NETHERLANDS B.V., Veldhoven (NL)

(72) Inventors: Coen Adrianus Verschuren, Eindhoven (NL); Erwin Paul Smakman, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 74 days.

(21) Appl. No.: 16/314,805

(22) PCT Filed: Jun. 27, 2017

(86) PCT No.: PCT/EP2017/065800
§ 371 (c)(1),
(2) Date: Jan. 2, 2019

(87) PCT Pub. No.: WO2018/015114
PCT Pub. Date: Jan. 25, 2018

(65) Prior Publication Data
US 2019/0339621 A1 Nov. 7, 2019

(30) Foreign Application Priority Data
Jul. 19, 2016 (EP) .................................... 16180164

(51) Int. Cl.
*G03F 7/20* (2006.01)
*G03F 7/00* (2006.01)

(52) U.S. Cl.
CPC ...... *G03F 7/70291* (2013.01); *G03F 7/70383* (2013.01); *G03F 7/70433* (2013.01); *G03F 7/70508* (2013.01)

(58) Field of Classification Search
CPC ............ G03F 7/70291; G03F 7/70325; G03F 7/70375; G03F 7/70383; G03F 7/70391;
(Continued)

(56) References Cited

U.S. PATENT DOCUMENTS

| 5,229,872 A | 7/1993 | Mumola |
| 5,296,981 A | 3/1994 | Ogawa |

(Continued)

FOREIGN PATENT DOCUMENTS

| CN | 101086627 | 12/2007 |
| CN | 104916586 | 9/2015 |

(Continued)

OTHER PUBLICATIONS

English translation of JP08-186064, published Jul. 16, 1996. (Year: 1996).*

(Continued)

*Primary Examiner* — Christina A Riddle
(74) *Attorney, Agent, or Firm* — Pilsbury Winthrop Shaw Pittman, LLP

(57) ABSTRACT

A direct write exposure apparatus configured to process a plurality of substrates, the apparatus including: a substrate holder configured to hold a substrate having a usable patterning area; a patterning system configured to project different patterns onto the substrate; a processing system configured to: determine a first combination of one or more patterns that are to be applied on a first substrate of the plurality of substrates; and determine a second, different combination of one or more patterns that are to be applied on a second, subsequent, substrate of the plurality of substrates.

20 Claims, 13 Drawing Sheets

(58) Field of Classification Search
CPC .. G03F 7/704; G03F 7/70425; G03F 7/70433; G03F 7/7045; G03F 7/70458; G03F 7/70466; G03F 7/70475; G03F 7/70483; G03F 7/70491; G03F 7/705; G03F 7/70508; G03F 7/70541; G03F 7/70616; G03F 7/7065; G03F 1/50
USPC ......... 355/18, 27, 30, 32, 39, 40, 46, 52–55, 355/67–77; 716/50–56, 100, 110, 116, 716/117, 118–125, 132, 135, 139
See application file for complete search history.

(56) References Cited

U.S. PATENT DOCUMENTS

| | | | |
|---|---|---|---|
| 5,523,193 | A | 6/1996 | Nelson |
| 6,238,852 | B1 * | 5/2001 | Klosner ................ G03F 7/2002 355/46 |
| 6,813,058 | B1 * | 11/2004 | Sandstrom ............. G03B 27/44 359/290 |
| 8,671,381 | B1 * | 3/2014 | Wang .................. G03F 7/70433 716/135 |
| 2006/0031801 | A1 * | 2/2006 | McIntyre ............ G06F 17/5072 716/55 |
| 2006/0221320 | A1 * | 10/2006 | Bleeker ............... G03F 7/70275 355/67 |
| 2011/0188016 | A1 | 8/2011 | De Jager et al. |
| 2012/0046775 | A1 * | 2/2012 | Chien .................... G03F 7/705 700/104 |
| 2012/0088329 | A1 * | 4/2012 | Ken ...................... H01L 21/304 438/107 |
| 2012/0185818 | A1 | 7/2012 | Leu et al. |
| 2015/0026650 | A1 | 1/2015 | Yeric |
| 2015/0262889 | A1 | 9/2015 | Yamashita et al. |

FOREIGN PATENT DOCUMENTS

| | | | |
|---|---|---|---|
| JP | S63181348 | | 7/1988 |
| JP | H042450 | | 1/1992 |
| JP | H05217843 | | 8/1993 |
| JP | 08186064 | A * | 7/1996 |
| JP | H09007924 | | 1/1997 |
| JP | 09199377 | A * | 7/1997 ......... G03F 7/70433 |
| JP | H09199377 | | 7/1997 |
| JP | 2003209172 | | 7/2003 |
| JP | 2004214564 | | 7/2004 |
| JP | 2005159158 | | 6/2005 |
| JP | 2005250308 | | 9/2005 |
| JP | 2006049403 | | 2/2006 |
| JP | 2006293352 | | 10/2006 |
| JP | 2015177071 | | 10/2015 |
| KR | 20120037872 | | 4/2012 |
| WO | 98/33096 | | 7/1998 |
| WO | 98/38597 | | 9/1998 |
| WO | 2009060514 | | 5/2009 |
| WO | 2010032224 | | 3/2010 |

OTHER PUBLICATIONS

English translation of JP09-199377, published Jul. 31, 1997. (Year: 1997).*
International Search Report and Written Opinion issued in PCT Patent Application No. PCT/EP2017065800, dated Oct. 4, 2017.
Xu, Gang, et al.: "A Multi-objective Floorplanner for Shuttle Mask Optimization", Proc. of SPIE, vol. 5567, 2004.
Kagalwalla, Abde A., et al.: "Design-Aware Defect-Avoidance Floorplanning of EUV Masks", IEEE Transactions on Semiconductor Manufacturing, vol. 26, No. 1, Feb. 2013.
Japanese Office Action issued in corresponding Japanese Patent Application No. 2019-500808, dated Dec. 13, 2019.
Korean Office Action issued in corresponding Korean Patent Application No. 10-2019-7004758, dated Feb. 8, 2020.
Chinese Office Action issued in corresponding Chinese Patent Application No. 2017800450113, dated May 25, 2020.
Korean Office Action Issued in corresponding Korean Patent Application No. 10-2021-7009692, dated Apr. 27, 2021.

* cited by examiner

DETERMINING THE COMBINATION OF PATTERNS TO BE APPLIED TO A SUBSTRATE IN A LITHOGRAPHY STEP

CROSS-REFERENCE TO RELATED APPLICATIONS

This application is the U.S. national phase entry of PCT patent application no. PCT/EP2017/065800, which was filed on Jun. 27, 2017, which claims the benefit of priority of European patent application no. 16180164.2, which was filed on Jul. 19, 2016, and which is incorporated herein in its entirety by reference.

FIELD

The present invention relates to a lithographic apparatus, in particular to a direct write lithographic apparatus.

BACKGROUND

A lithographic apparatus is a machine that applies a desired pattern onto a substrate or part of a substrate. A lithographic apparatus may be used, for example, in the manufacture of integrated circuits (ICs), flat panel displays, and other devices or structures having fine features. In a conventional lithographic apparatus, a patterning device, which may be referred to as a mask or a reticle, may be used to generate a circuit pattern corresponding to an individual layer of the IC, flat panel display, or other device). This pattern may be transferred on (part of) the substrate (e.g. silicon wafer or a glass plate), e.g. via imaging onto a layer of radiation-sensitive material (resist) provided on the substrate.

Instead of a circuit pattern, the patterning device may be used to generate other patterns, for example a color filter pattern, or a matrix of dots. Instead of a conventional mask, the patterning device may comprise a patterning array that comprises an array of individually addressable elements that generate the circuit or other applicable pattern. An advantage of such a "maskless" system compared to a conventional mask-based system is that the pattern can be provided and/or changed more quickly and for less cost.

Thus, a maskless system includes a programmable patterning device (e.g., a spatial light modulator, a contrast device, etc.). The programmable patterning device is programmed (e.g., electronically or optically) to form the desired patterned beam using the array of individually addressable elements. Types of programmable patterning devices include micro-mirror arrays, liquid crystal display (LCD) arrays, grating light valve arrays, and the like.

SUMMARY

It is desirable to provide a flexible, low cost lithographic apparatus.

In an embodiment of the present invention, there is provided a direct write exposure apparatus configured to process a plurality of substrates, the apparatus comprising:
a substrate holder configured to hold a substrate having a usable patterning area;
a patterning system configured to project different patterns onto the substrate;
a processing system configured to:
determine a first combination of one or more patterns, selected from the different patterns, that are to be applied on a first substrate of the plurality of substrates; and
determine a second combination of one or more patterns, different from the first combination of one or more patterns, that are to be applied on a second, subsequent, substrate of the plurality of substrates.

In another embodiment of the present invention, there is provided a method of configuring a direct write exposure apparatus, the method comprising the steps of:
receiving dimensions of a usable patterning area of a substrate to be processed by the apparatus;
receiving dimensions of different patterns available for patterning onto the substrate;
determining a combination of one or more patterns, selected from the different patterns, that are to be applied onto the substrate, the combination of one or more patterns fitting onto the usable patterning area in a non-overlapping manner;
wherein the step of determining the combination of one or more patterns uses a substrate utilisation criterion.

In yet another embodiment of the present invention, there is provided an exposure apparatus comprising:
a substrate holder configured to hold a substrate having a usable patterning area;
a patterning device configured to provide radiation modulated according to a desired pattern;
a projection system configured to project the modulated radiation onto a desired location on the usable patterning area of the substrate;
the patterning device and projection system being configured to project different patterns onto the substrate;
a processing system configured to process a plurality of substrates by performing, for each of the plurality of substrates, the step of:
determining a combination of one or more patterns, selected from the different patterns, that are to be applied onto the substrate, using a substrate utilisation criterion.

BRIEF DESCRIPTION OF THE DRAWINGS

The accompanying drawings, which are incorporated herein and form a part of the specification, illustrate embodiments of an invention and, together with the description, further serve to explain the principles of embodiments of the invention and to enable a person skilled in the pertinent art to make and use the embodiments.

DETAILED DESCRIPTION

Several embodiments or lithographical apparatuses, in particular direct write lithographical apparatuses, and methods of operating a lithographical apparatus are disclosed herein.

Within the meaning of the present invention, a direct write exposure apparatus refers to a maskless lithographic apparatus comprising a programmable patterning device, e.g. a spatial light modulator, a contrast device, etc. The programmable patterning device is programmed (e.g., electronically or optically) to form the desired patterned beam using the array of individually addressable elements. Types of programmable patterning devices include micro-mirror arrays, liquid crystal display (LCD) arrays, grating light valve arrays, and the like. More details on such patterning devices are provided below.

In an embodiment, the present invention may however be applied in a lithographic exposure apparatus comprising a mask, the mask e.g. being provided with a plurality of different patterns that can be projected, e.g. via a projection system, onto a substrate to be processed.

In an embodiment of the present invention, the direct write lithographic apparatus, also referred to as a maskless lithographic apparatus, a direct write exposure apparatus or a maskless exposure apparatus, may be configured to project different patterns onto a substrate, e.g. N different patterns, N being an integer value >1. In particular, the direct write exposure apparatus may comprise a patterning system for projecting such patterns onto a substrate.

Figure 1A:
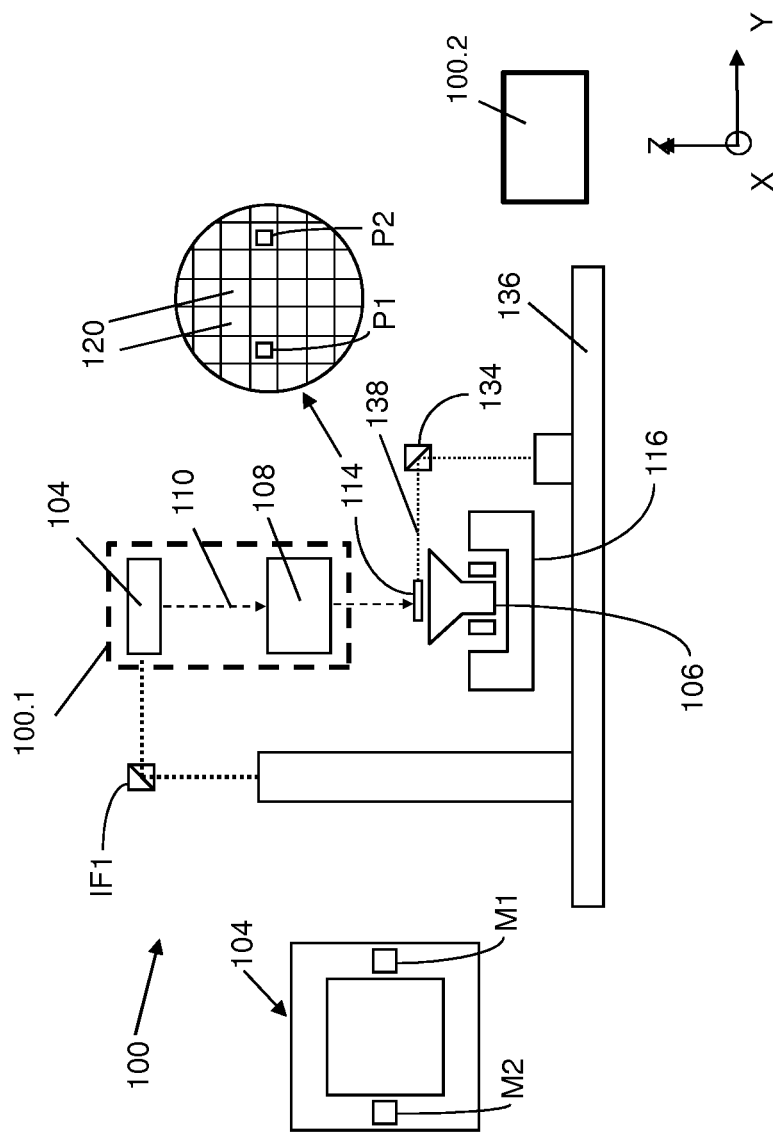
FIG. 1a schematically depicts part of a lithographic apparatus according to an embodiment of the present invention.

In an embodiment of the present invention, a direct write exposure apparatus may comprise a substrate holder, a patterning device system and a processing system, as schematically shown in FIG. 1*a*. FIG. 1*a* schematically shows a direct write apparatus 100 according to an embodiment of the present invention, the apparatus comprising an object holder, a pattering system 100.1 configured to project a pattern, e.g. modulated radiation pattern, onto an object 114, e.g. a substrate. In the embodiment as shown, the patterning system 100.1 comprises a patterning device 104 and a projection system 108.

In accordance with the present invention, the patterning system 100.1 is configured to project different patterns onto a substrate.

Because the projecting or patterning of a substrate using a programmable patterning device is not restricted to a particular pattern that is available on a mask, a direct write exposure apparatus enables a more versatile and more flexible utilization of a substrate.

In an embodiment, the different patterns may be applied to generate different devices, e.g. different displays or screens having a different resolution or pixel density.

In an embodiment, the different patterns may have different dimensions.

Figure 1B:
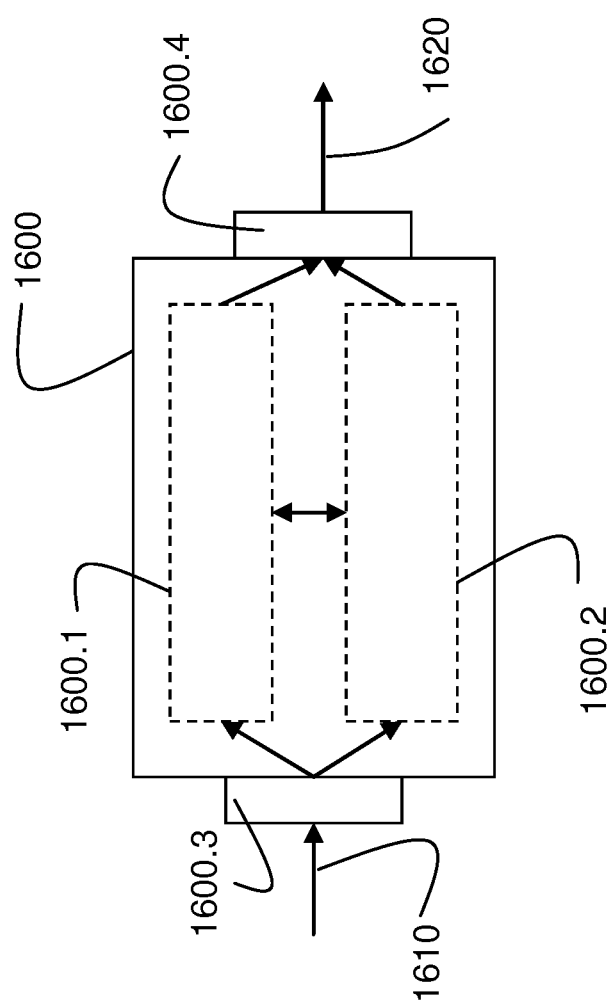
FIG. 1b schematically depicts a processing system as can be applied in a lithographic apparatus according to the present invention.

The direct write or maskless exposure apparatus according to the present invention, further comprises a processing system 100.2 configured to control the various components of the exposure apparatus. In an embodiment, the processing system 100.2 may comprise one or more processing units such as microprocessors, microcontrollers, computers or the like, such processing units typically being configured to process data, e.g. input data received at an input terminal of the processing unit and output processed data, e.g. control signals for controlling one or more of the components of the exposure apparatus, the processed data being outputted via an output terminal of the processing unit. In an embodiment, the processing system 100.2 may be located inside the direct write apparatus. Alternatively, the processing system 100.2 may be located apart from the apparatus, e.g. connected via a communication network. FIG. 1*b* schematically shows a possible structure of a processing system or processing unit as can be applied in the present invention. A processing system 1600 as applied in the present invention may e.g. comprise a processor 1600.1, a microprocessor, a computer or the like for processing data or signals that are received. In an embodiment, the processing system may further comprise a memory 1600.2 or memory unit for storing data such as any received signals, e.g. from a measurement system, or information. In the embodiment as shown, the processing unit 1600 comprises an input terminal 1600.3 for receiving data or signals 1610 and an output terminal 1600.4 for outputting signals or data 1620, e.g. data or signals obtained after being processed by the processor 1600.1 of the processing unit 1600. Communications paths may be provided inside the processing unit 1600 (indicated by the arrows) between the input and output terminals 1600.3, 1600.4 and the processor and memory unit 1600.1, 1600.2.

In an embodiment of the present invention, the processing system as applied may e.g. be configured to determine which pattern or patterns are to be applied on a particular substrate. In particular, in an embodiment of the present invention, the processing system may be configured to:

determine, for a substrate of a lot of substrates that is to processed by the exposure apparatus, a combination of one or more patterns that are to be applied on the substrate; and determine, for a subsequent substrate of the lot of substrates, a different combination of one or more patterns that are to be applied on the subsequent substrate.

In such an embodiment, the processing system, e.g. processing system 1600 as shown in FIG. 1*b*, may thus be configured to determine for each substrate of a lot of substrates, which pattern or patterns are to be applied. As mentioned, the different patterns may e.g. be related to different devices that are to be manufactured and/or to patterns having different dimensions. With reference to FIG. 1*b*, the processing system 1600 may thus be configured to receive information, in particular geometric information, about the different patterns that can be patterned. This information may e.g. be received via the input terminal 1600.3 of the processing system and stored in the memory unit 1600.2.

In an embodiment of the present invention, as e.g. shown in FIG. 1*a*, the patterning system 100.1 comprises a patterning device 104, the patterning device 104 being configured to provide radiation that is modulated according to a desired pattern, and a projection system 108, the projection system 108 being configured to project the modulated radiation, indicated in FIG. 1 as the patterned beam 110, onto a desired location on the substrate.

In accordance with the present invention, the area of the substrate onto which a pattern can be projected is in general referred to as the usable patterning area.

In accordance with an embodiment of the present invention, the processing system as applied in the exposure apparatus is thus configured to determine which patterns, in particular which combination of one or more patterns, e.g. selected out of N available patterns, are to be projected onto the usable patterning area.

In an embodiment, the processing system, e.g. a dedicated processing unit, may be configured to control the patterning system 100.1, e.g. the patterning device 104 and/or the projection system 108 to expose the substrate with the combination of one or more patterns as determined, i.e. to project the modulated radiation, representing the one or more patterns, onto the appropriate location within the usable patterning area.

Within the meaning of the present invention, 'determining a combination of one or more patterns' thus involves both the step of selecting the pattern or patterns to be applied and the step of determining an appropriate location for the one or more patterns. As will be understood by the skilled person, the combination of one or more patterns should fulfil the requirement that the combination of the one or more patterns fits onto the usable patterning area in a non-overlapping manner.

In an embodiment, the step of determining the combination of the one or more patterns may also take account of certain manufacturing constraints, e.g. a desired or required spacing between adjacent patterns on the substrate, in order to enable appropriate separation or dicing of the patterns.

In an embodiment of the present invention, the processing system as applied in the exposure apparatus according to the present invention is configured to determine the combination of the one or more patterns that are to be applied by means of a criterion, referred to as the substrate utilization criterion.

In an embodiment of the present invention, the substrate utilization criterion may be used to determine the most appropriate combination of one or more patterns so as to utilize the usable patterning area as much as possible.

This is illustrated in the following Figures.

Figure 2:
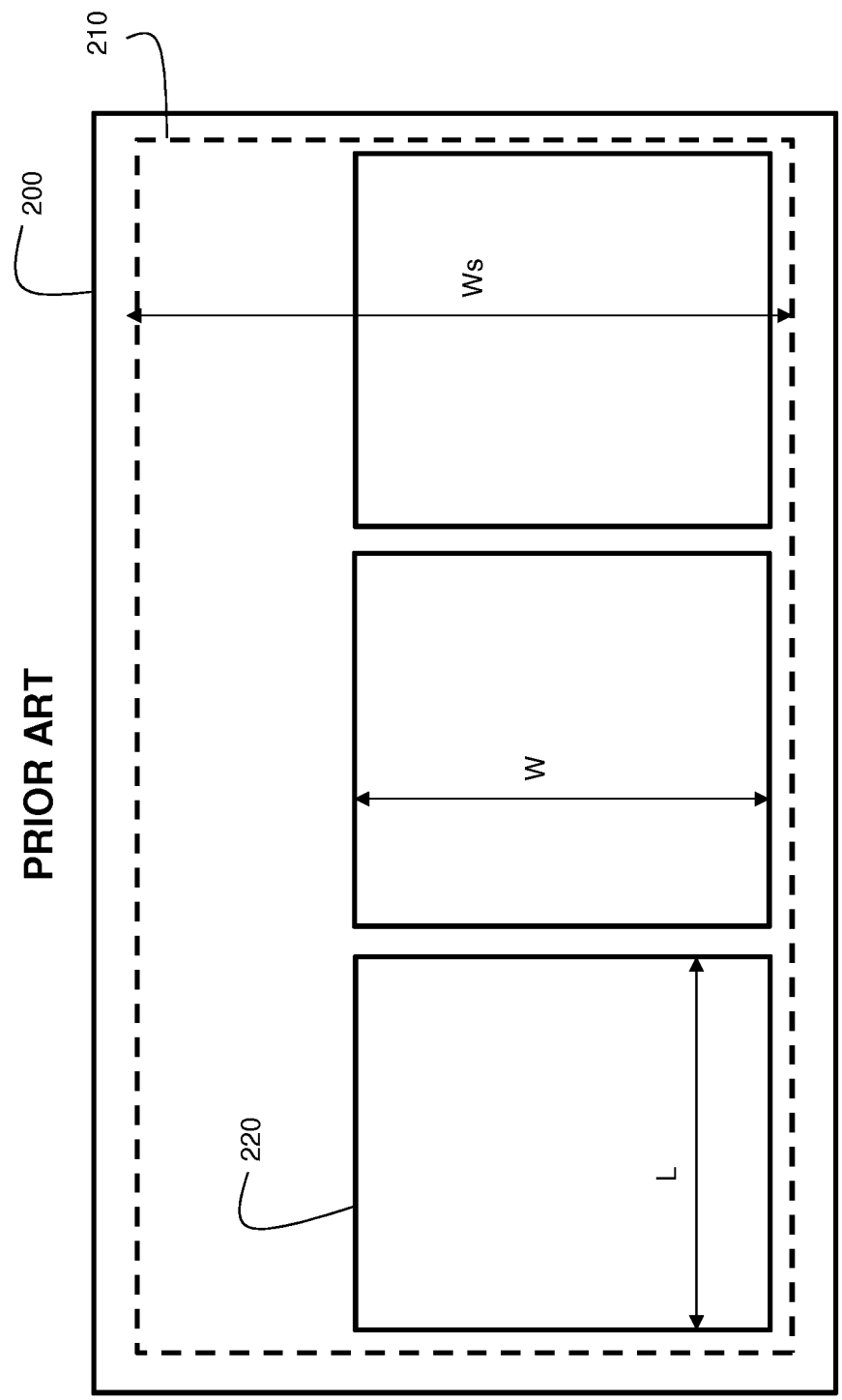
FIG. 2 schematically depicts a utilization of a substrate as can be obtained using a prior art lithographic apparatus.

FIG. 2 schematically shows the utilization of a usable patterning area of a substrate in case the exposure apparatus is only equipped to pattern one particular pattern. FIG. 2 schematically shows a substrate 200 having a usable patterning area 210 onto which a particular pattern 220 is projected three times, the pattern having a length L and a width W. As can be seen, there still remains a considerable portion of the substrate that cannot be patterned, due to a mismatch between the width Ws of the substrate and the width W of the pattern 220 that can be applied by the apparatus.

In case the apparatus is configured to project different patterns, e.g. patterns having different sizes, onto a substrate, a more effective use of the usable patterning area can be made.

Figure 3:
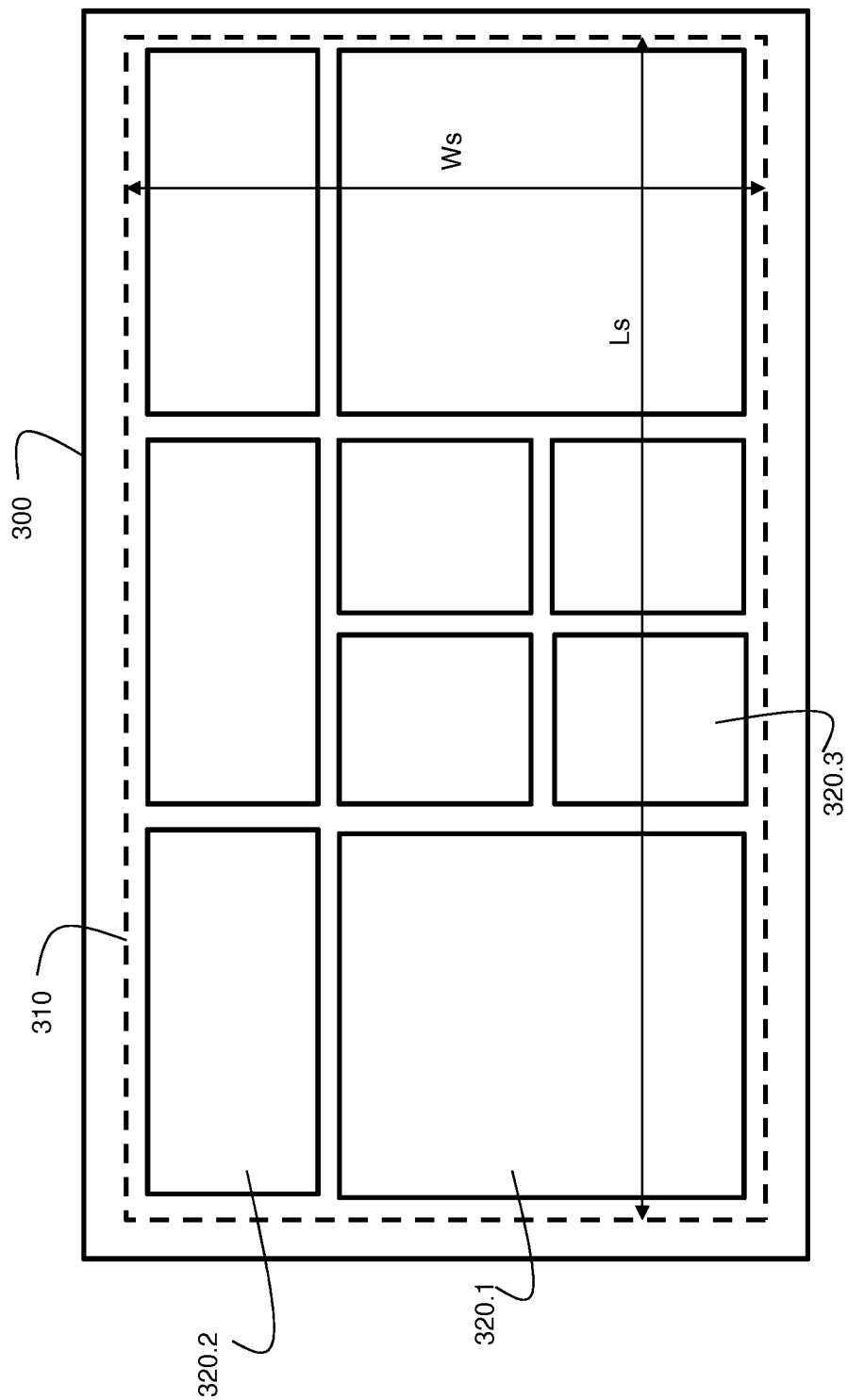
FIG. 3 schematically depicts a utilization of a substrate as can be obtained using a lithographic apparatus according to the present invention.

FIG. 3 schematically shows a substrate 300 having a usable patterning area 310 onto which a combination of three differently sized patterns 320.1, 320.2 and 320.3 is projected. As can be seen, by using a combination of differently sized patterns, a more effective utilization of the usable patterning area can be made.

In an embodiment of the present invention, the utilization U of the usable patterning area may be expressed mathematically by:

$$U = \frac{\sum_{i=1}^{M} A_i}{As} \quad (1)$$

Wherein:
M=the number of patterns applied on the usable patterning area;
$A_i$=the area of pattern i of the M patterns;
As=the usable patterning area of the substrate In an embodiment, the area of a pattern may take account of any margin required, e.g. a margin for scribe lines or lanes.

The utilization U may also be referred to as a fill factor of the substrate, in that it represents what part of the substrate is effective filled with a pattern.

In the example shown in FIG. 3, the utilization U could thus be calculated by adding two times the area of pattern 320.1, three times the area of pattern 320.2 and four times the area of pattern 320.3 and dividing this by the area As=Ws×Ls of the usable patterning area. As such, it can be noted that the substrate utilization criterion U makes use of dimensions of the different patterns used in the combination and of the dimensions of the usable patterning area of the substrate.

In an embodiment of the present invention, the processing system as applied in the lithographic apparatus, e.g. processing system 100.2 as shown in FIG. 1a, may be configured to assess the substrate utilization criterion for a plurality of different combinations and select the most favorable combination. In such embodiment, the substrate utilization criterion may comprise an optimization function, e.g. a mathematical expression of the utilization of the substrate, such as the mathematical expression (1).

As will be appreciated by the skilled person, in case the exposure apparatus is equipped to project N different patterns onto a substrate, there may be various options, i.e. various combinations of one or more patterns, to substantially fill the usable patterning area of the substrate with pattern. This is illustrated in FIGS. 4 (a)-(c).

Figure 4:
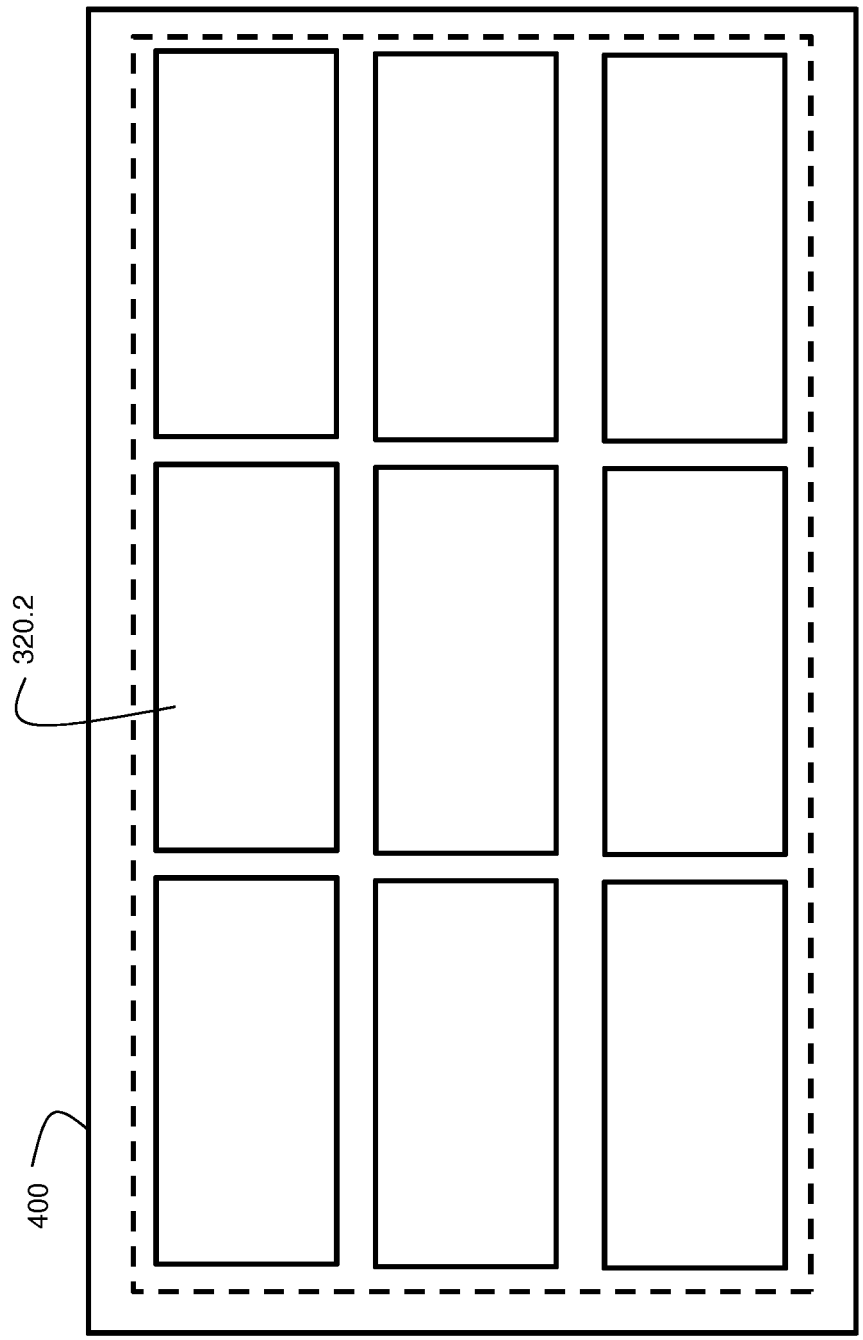
FIGS. 4 (*a*)-(*c*) schematically depict alternative utilizations of the substrate of FIG. 3.
Figure 4:
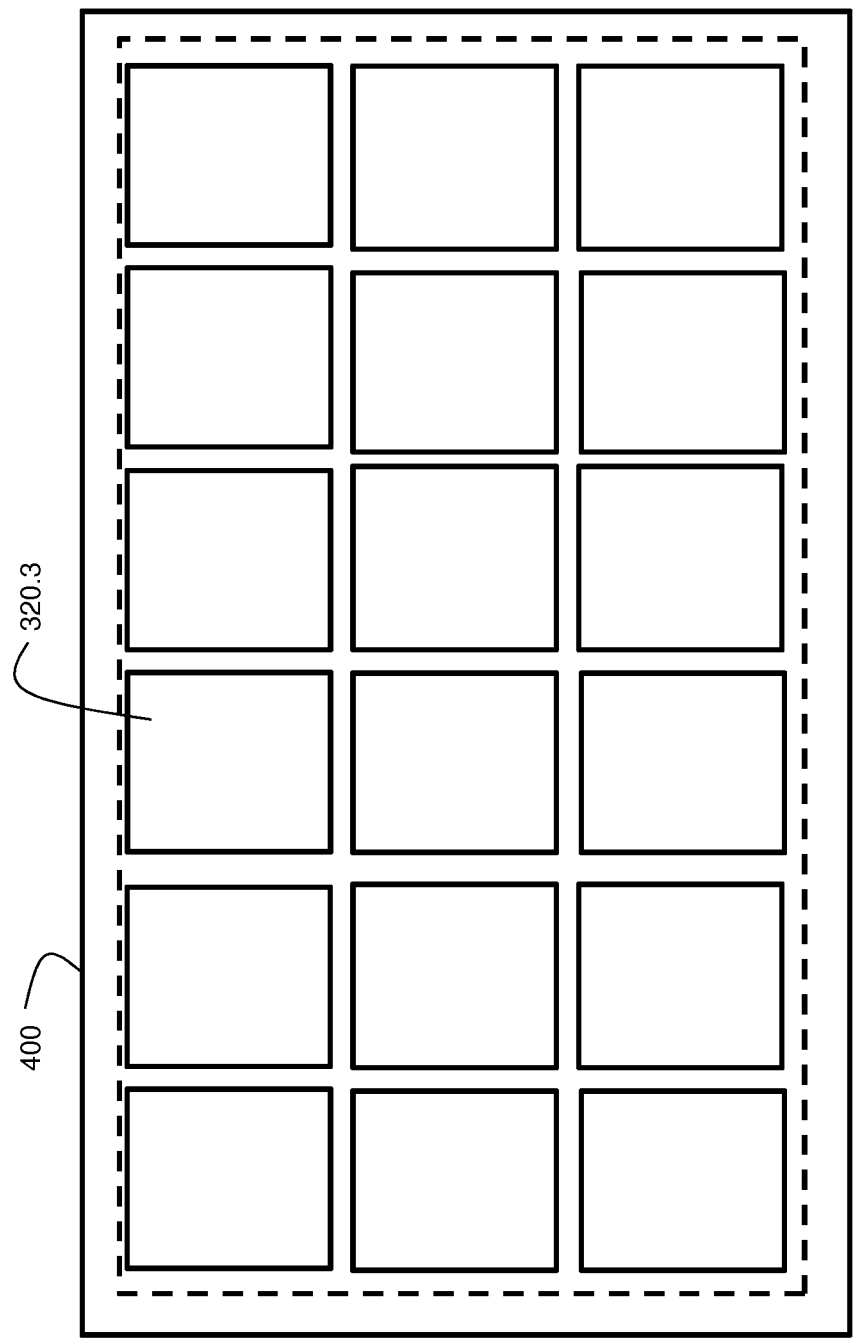
Figure 4:
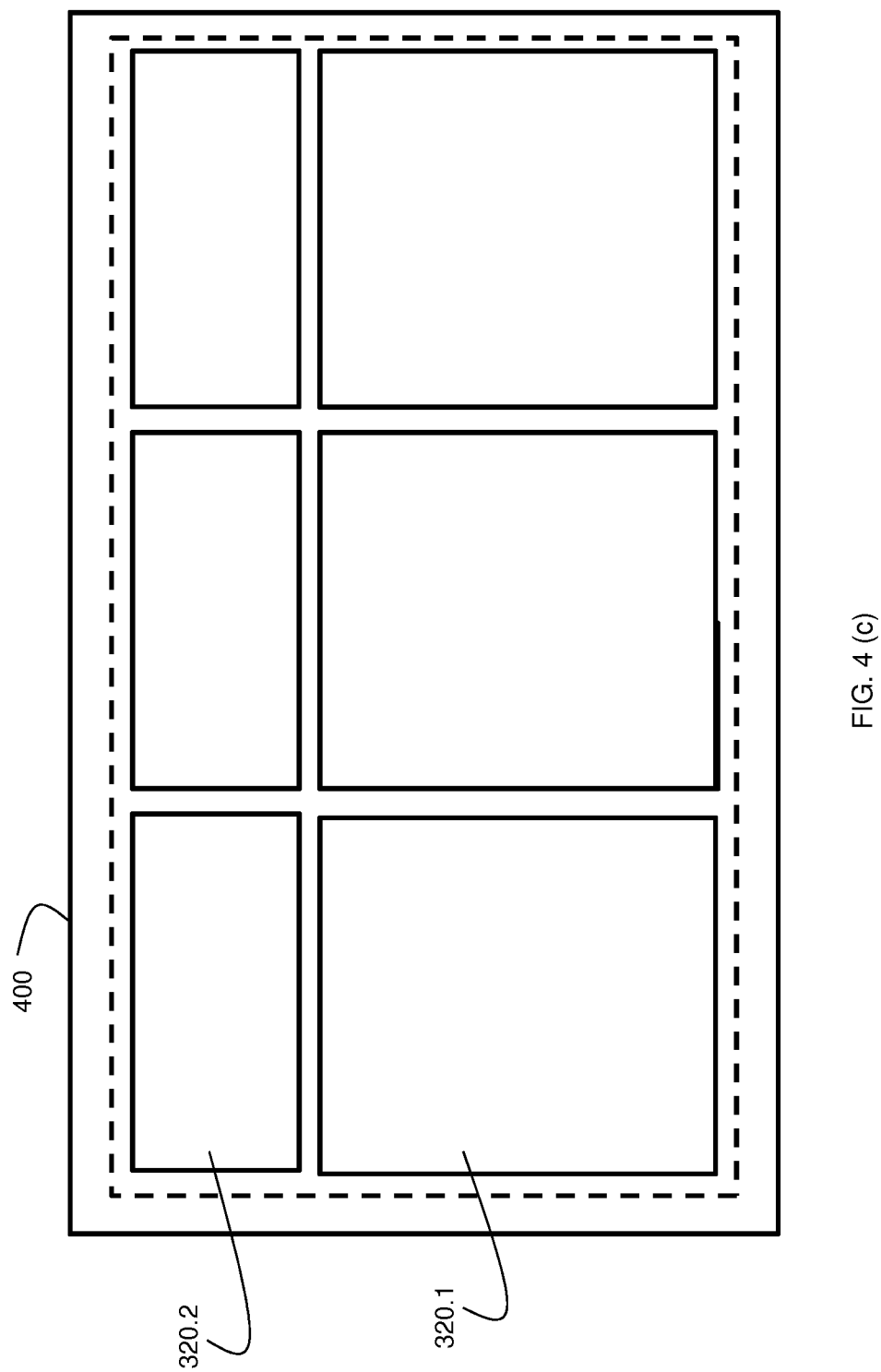

FIGS. 4 (a)-(c) schematically show three alternative combinations for exposing a substrate 400 in case the exposure apparatus is equipped to apply the patterns 320.1, 320.2 and 320.3 as show in FIG. 3.

In FIG. 4 (a), the combination of patterns applied on the substrate consists of 9 projections of the pattern 320.2.

In FIG. 4 (b), the combination of patterns applied on the substrate consists of 18 projections of the pattern 320.3.

In FIG. 4 (c), the combination of patterns applied on the substrate consists of 3 projections of the pattern 320.1 and three projections of the pattern 320.2.

As will be understood, when combining all three available patterns, there is a large combination of patterns possible. In this respect, it is worth noting that, as already indicated above, a particular combination of one or more patterns is characterized both by the applied patterns and by the particular location of the patterns.

Figure 5:
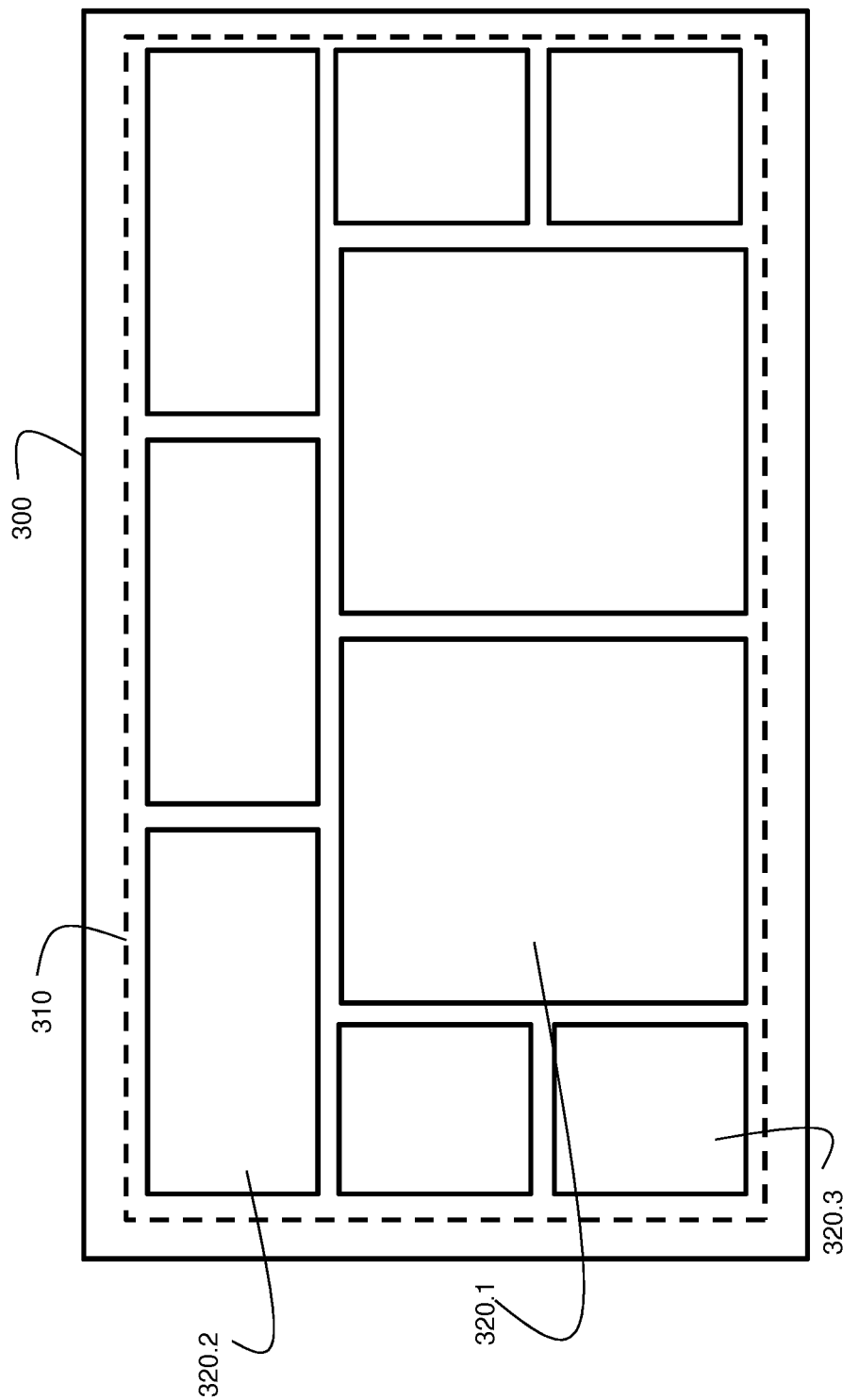
FIG. 5 schematically depicts an alternative arrangement for the combination of patterns as shown in FIG. 3.

To illustrate this, the combination of patterns 320.1, 320.2 and 320.3 as schematically shown in FIG. 5 is considered to be different from the combination shown in FIG. 3, despite the fact that the same number of patterns of each type is applied on the substrate 500. In particular, the combination of patterns as shown in FIG. 5 also comprises, as in FIG. 2, two patterns of size 320.1, three patterns of size 320.2 and four patterns of size 320.3.

In case an optimal utilization of the usable patterning area of a substrate is aimed for, as e.g. expressed by equation (1), one may notice that there are still a large number of combinations of one or more patterns, e.g. selected out of N different patterns, that result in the same or substantially the same utilization. In particular, the skilled person will appreciate that the utilization of the substrate 300 in FIG. 3 will be the same as the utilization of the substrate 500 shown in FIG. 5, assuming the substrate 500 having the same usable patterning area as the substrate 300. Further, one may also assess that the utilization of the substrates 400 as shown in FIGS. 4 (a)-(c) will not deviate much from the utilization of the substrates shown in FIGS. 3 and 5.

As such, the mere application of the substrate utilization as a criterion to arrive at a particular combination of patterns to be applied may result in multiple combinations having the same or substantially the same utilization. In such a situation, one may, in order to determine the actual combination that is to be applied on the substrate, make use of a more detailed substrate utilization criterion.

Therefore, in an embodiment of the present invention, the processing system as applied in the lithographic apparatus may be configured to take alternative or additional criterions or boundary conditions into account, to arrive at the preferred combination of patterns to be applied on a particular substrate, e.g. a particular substrate in a lot of substrates.

In an embodiment of the present invention, the processing system makes us of a substrate utilization criterion that comprises a manufacturing parameter or makes use of a combined criterion comprising a substrate utilization criterion and a manufacturing criterion. In the latter case, weight factors can be applied to tune the relative importance of both criterions. The use of such a manufacturing parameter or criterion may be applied to further distinguish between various possible combinations. By e.g. applying weight factors, the relative importance of the various criterions may be tuned.

Below, several examples of manufacturing parameters or criterions will be discussed which may be applied in a substrate utilization criterion or in combination with such a criterion.

As a first example, the manufacturing parameter or criterion may be associated with a desired production of the N different patterns. Referring to the substrate utilisation as schematically shown in FIGS. 4 (a) and 4 (b), one can understand that applying the combination of patterns as shown in FIG. 4 (a) or the combination of patterns as shown in FIG. 4 (b) would result in the manufacturing of devices having the pattern 320.2 and/or devices having the pattern 320.3. In such a situation, there would be no devices made with the pattern 320.1. In order to take a desired production of a particular device, associated with a particular pattern, into account, the manufacturing parameter or criterion may e.g. make use of one or more of the following information:

A forecasted demand for a particular device,
An available stock of a particular device,
Available production means for a particular device,
Etc . . . .

Using such parameters, a criterion may be devised which favors combinations of patterns that are most needed.

Figure 6:
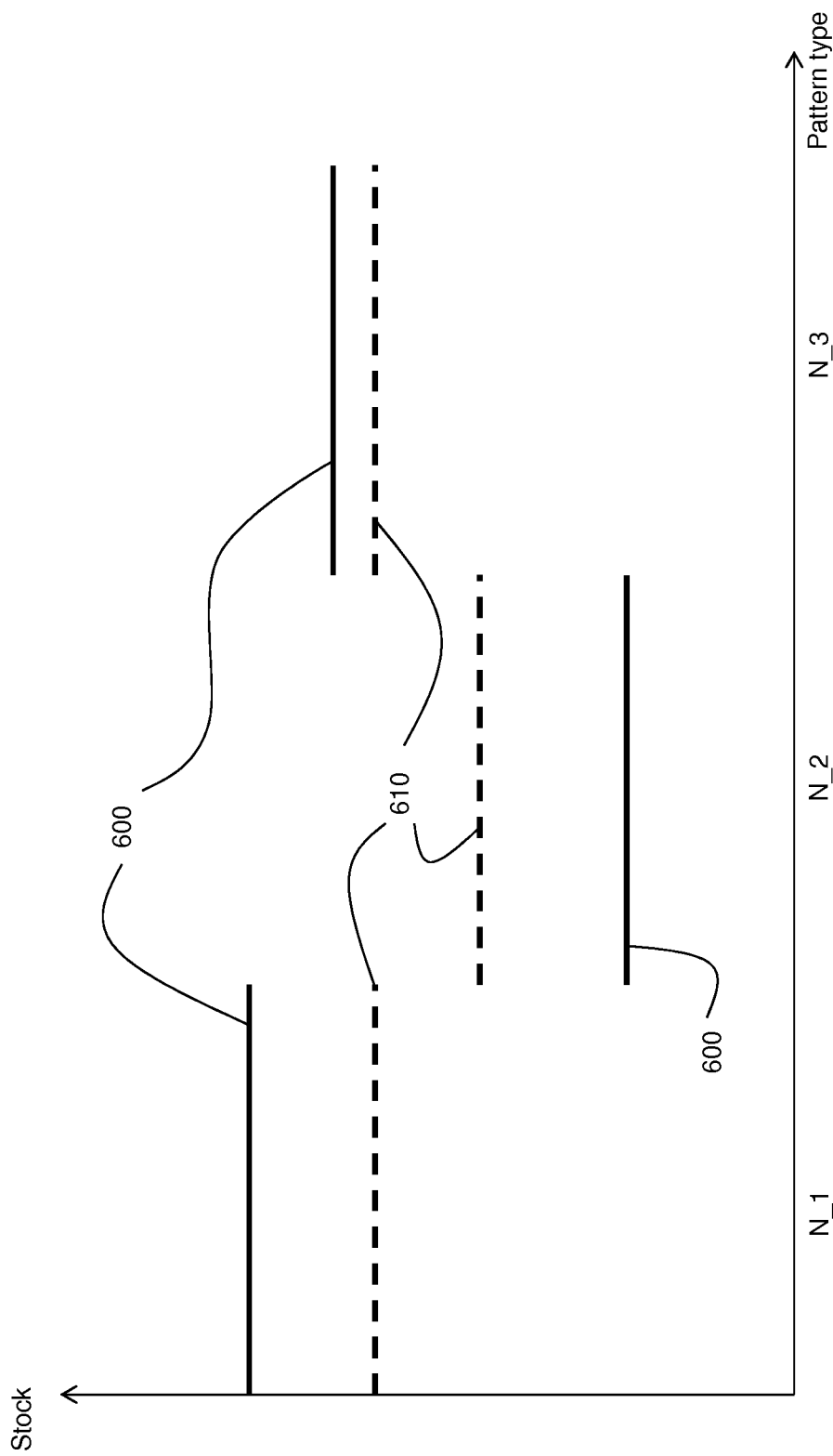
FIG. 6 schematically depicts levels of available devices vs. levels of desired devices for three different devices.

A possible implementation of such a criterion is hereby illustrated with reference to FIG. 6. FIG. 6 schematically shows, for three different pattern types or devices N_1, N_2 and N_3 out of N devices or patterns, an actual number of devices available (e.g. in stock, indicated by the solid lines 600) and a desired or required number of devices, indicated by the dotted lines 610. For the situation as depicted, one can observe that the actual number of devices N_1 and N_3 available is larger than desired or required, whereas the actual number of devices N_2 available is smaller than desired or required number of devices. When such an analysis is available, this knowledge may be used to select the most favorable or preferred combination of patterns. In particular, in order to address the mismatch between the actual number of devices and the desired number of devices, combinations of patterns that include one or more patterns associated with the device N_2 should be favored over combinations that do not contain this pattern.

An example of how this could be implemented mathematically is given by equation (2):

$$P = \sum_{i=1}^{M} P_i, \quad P_i = \frac{DP_i - AP_i}{DP_i} \tag{2}$$

Wherein:
P=production utilization;
M=the number of patterns applied on the usable patterning area;
$DP_i$=the desired or required production or stock of devices made using pattern i;
$AP_i$=the available production or stock of devices made using pattern i.

As can be see from equation (2), the productivity utilization P has a positive contribution ($Dp_i$>$AP_i$) for those patterns that are needed (desired production or stock being larger than the actual production or stock) and has a negative contribution for those patterns that are not required (the actual stock being larger than desired).

Equation (2) can be considered an example of a manufacturing criterion or parameter taking a discrepancy between a desired stock and an actual stock into account.

In the example as shown, the positive or negative contribution is made proportional to the number of patterns of the particular type i.

As will be understood, a large number of alternative criteria may be devised to evaluate whether or not a particular combination of patterns is desired, from a production or manufacturing point of view.

In an embodiment of the present invention, a combined criterion C, e.g. combining a substrate utilization criterion as e.g. expressed by equation (1) and a productivity utilization criterion as e.g. expressed by equation (2) may be applied, as illustrated by equation (3).

$$C = \alpha_1 \frac{\sum_{i=1}^{M} A_i}{As} + \alpha_2 \sum_{i=1}^{M} P_i = \alpha_1 U + \alpha_2 P \tag{3}$$

Wherein:
$\alpha_1, \alpha_2$: weight factors applied to the substrate utilization U and the production utilization P respectively.

In case such a combined utilization criterion is used, the processing system as applied in a lithographic apparatus according to the present invention may be configured to assess the combined utilization, as e.g. expressed by equation (3), for a plurality of combination of patterns and select the combination having the largest combined utilization.

As an alternative to applying a combined criterion, the processing system as applied in a lithographic apparatus according to the present invention may be configured to sequentially apply different criteria to arrive at the preferred combination of patterns to be applied. In such embodiment, the processing system may e.g. be configured to assess a plurality of different combinations of patterns using the substrate utilization criterion, e.g. using equation (1), select a set of these combinations having a desired or required minimum substrate utilization value, e.g. U>0.9, evaluate the productivity utilization, e.g. using equation (2), of the selected set of combinations and select the combination having the highest productivity utilization P.

As a second example of a manufacturing parameter or criterion that may be applied in the present invention, defect information can be mentioned. In an embodiment of the present invention, the processing system as applied in the lithographic apparatus according to the present invention, may be configured to receive, e.g. at an input terminal of the processing system, defect information associated with a particular substrate. In particular, the processing system may receive information indicative of a location of a defect on a substrate that is to be processed. Such defect information may e.g. be made available after the substrate has been scanned for defects. Such a scanning for defects may e.g. be implemented in the lithographic apparatus itself or may be performed outside the lithographic apparatus.

Figure 7:
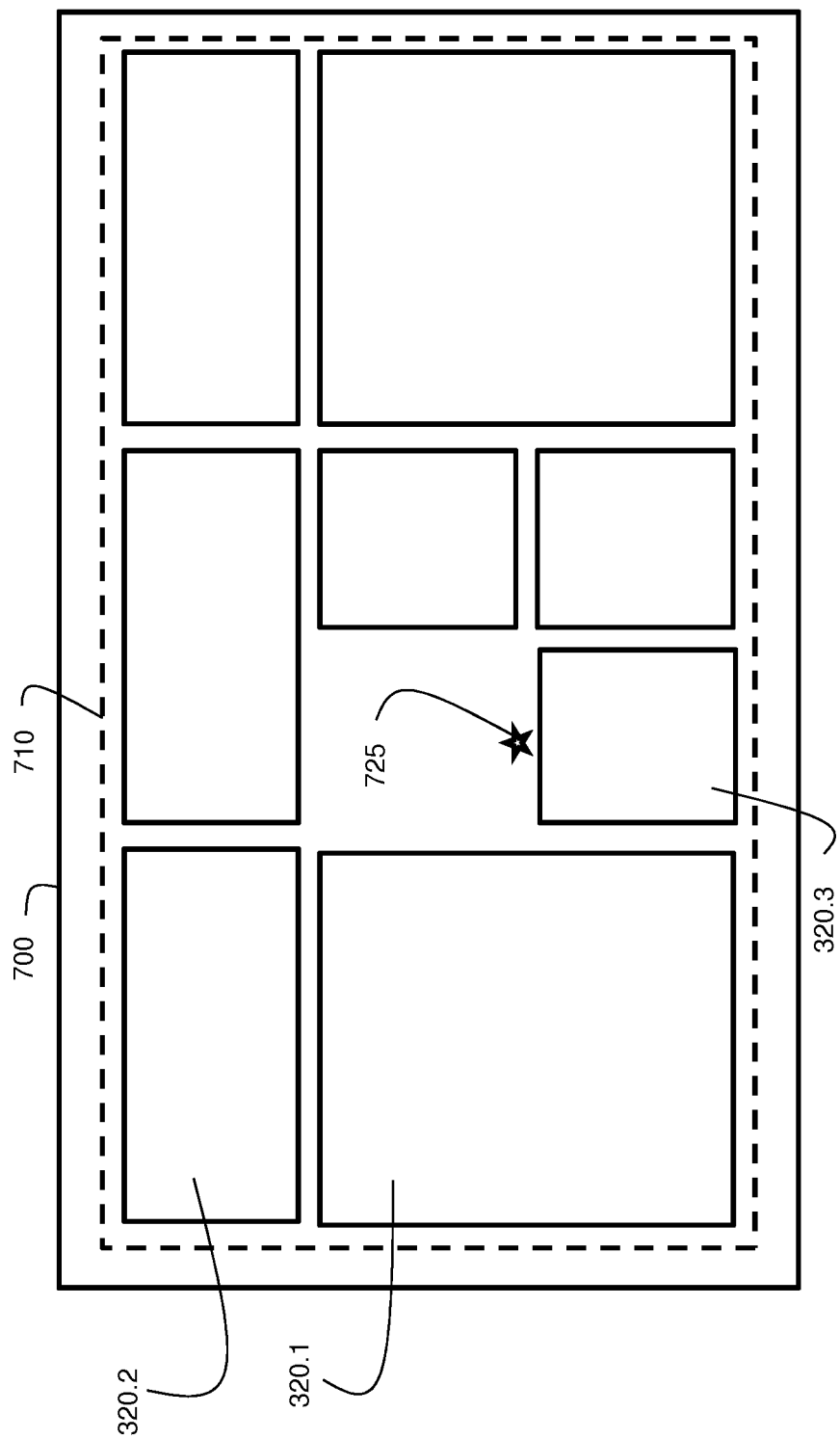
FIG. 7 schematically depicts the utilization of a substrate that includes a defect.

The use of such defect information in the selection of the appropriate combination of one or more patterns to be applied is schematically illustrated in FIG. 7. FIG. 7 schematically shows a substrate 700 having a usable patterning area 710. The substrate 700 further has a defect 725 located at a particular location, referred to as the substrate defect location, within the usable patterning area 710. In an embodiment of the present invention, the processing system of the lithographic apparatus, e.g. processing system 100.2 as shown in FIG. 1 is configured to take the defect information into account when determining the combination of patterns to be applied. In particular, the processing system may be configured to select and arrange the combination of one or more patterns to be applied in such manner that none of the patterns overlaps the substrate defect location. In FIG. 7, a combination of patterns 320.1, 320.2 and 320.3 is shown whereby none of the applied patterns overlaps the detect 725. The arrangement of patterns as applied may be compared to the arrangement of FIG. 4 (c), whereby the middle of the three patterns 320.1 is replaced by three patterns 320.3, in order to avoid the defect. As will be understood by the skilled person, the process of taking account of defect information may enable a higher yield, i.e. a higher percentage or number of properly functioning devices realized per substrate or lot of substrates.

Taking account of the defect information in the process of determining the combination of patterns to be applied can be done in various ways.

As a first example, the processing system as applied may be configured to use a substrate utilization criterion as e.g. indicated by equation (1), but disregarding the contribution of a pattern if it overlaps with the defect location. This can e.g. be expressed as:

$$Ud = \frac{\sum_{i=1}^{M} A_i \cdot \delta_i}{As} \quad (4)$$

Wherein:
Ud=substrate utilization taking a defect location into account;
M=the number of patterns applied on the usable patterning area;
$A_i$=the area of pattern i of the M patterns;
$\delta_i$=1 if pattern i does not overlap with the defect location;
$\delta_i$=0 if pattern i does overlap with the defect location;
As=the usable patterning area of the substrate As a second example, the processing system may be configured to subdivide the usable patterning area into sub areas that are free of defects and apply a substrate utilization criterion on each of the sub areas.

Figure 8:
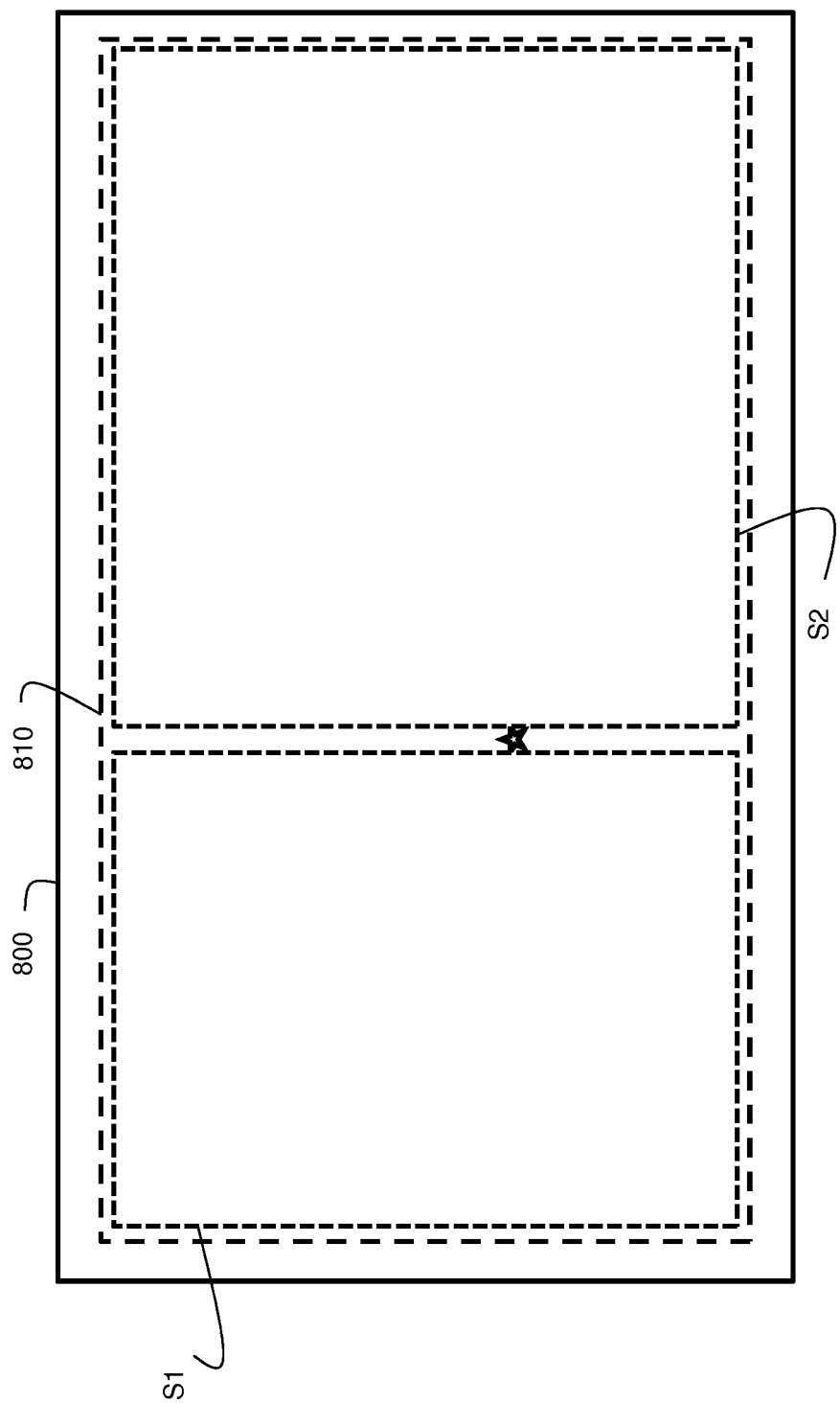
FIG. 8 schematically depicts a subdivision of a substrate's usable patterning area in defect-free sub areas.

This is schematically illustrated in FIG. 8. In FIG. 8, the usable patterning area 810 of a substrate 800 is subdivided into two areas S1 and S2 which are defect free. The processing system as applied can then be configured to determine an optimal utilization of each of the sub areas, taking account of the dimensions of the available patterns and the dimensions of the sub areas. As will be understood, there are various ways to subdivide the usable patterning area into defect free sub areas. In an embodiment, the processing system is configured to assess the substrate utilization criterion for multiple, different ways of subdividing the usable patterning area. This may be useful because the manner in which the usable patterning area is subdivided may affect the combinations that are possible. As an example, the processing system as applied in the present invention would not arrive at the combination of patterns as shown in FIG. 7 when subdividing the usable patterning area as shown in FIG. 8.

With respect to the utilization of a substrate that is patterned using a direct write lithographic apparatus, it can be pointed out that the patterning of a pattern is not limited to a particular orientation of the pattern. In the examples as shown above, the same orientation of the patterns 320.1, 320.2 and 320.3 is applied. Using the orientation as an additional variable for combining the one or more patterns that are to be applied on a substrate, may enable a more favorable utilization.

Figure 9:
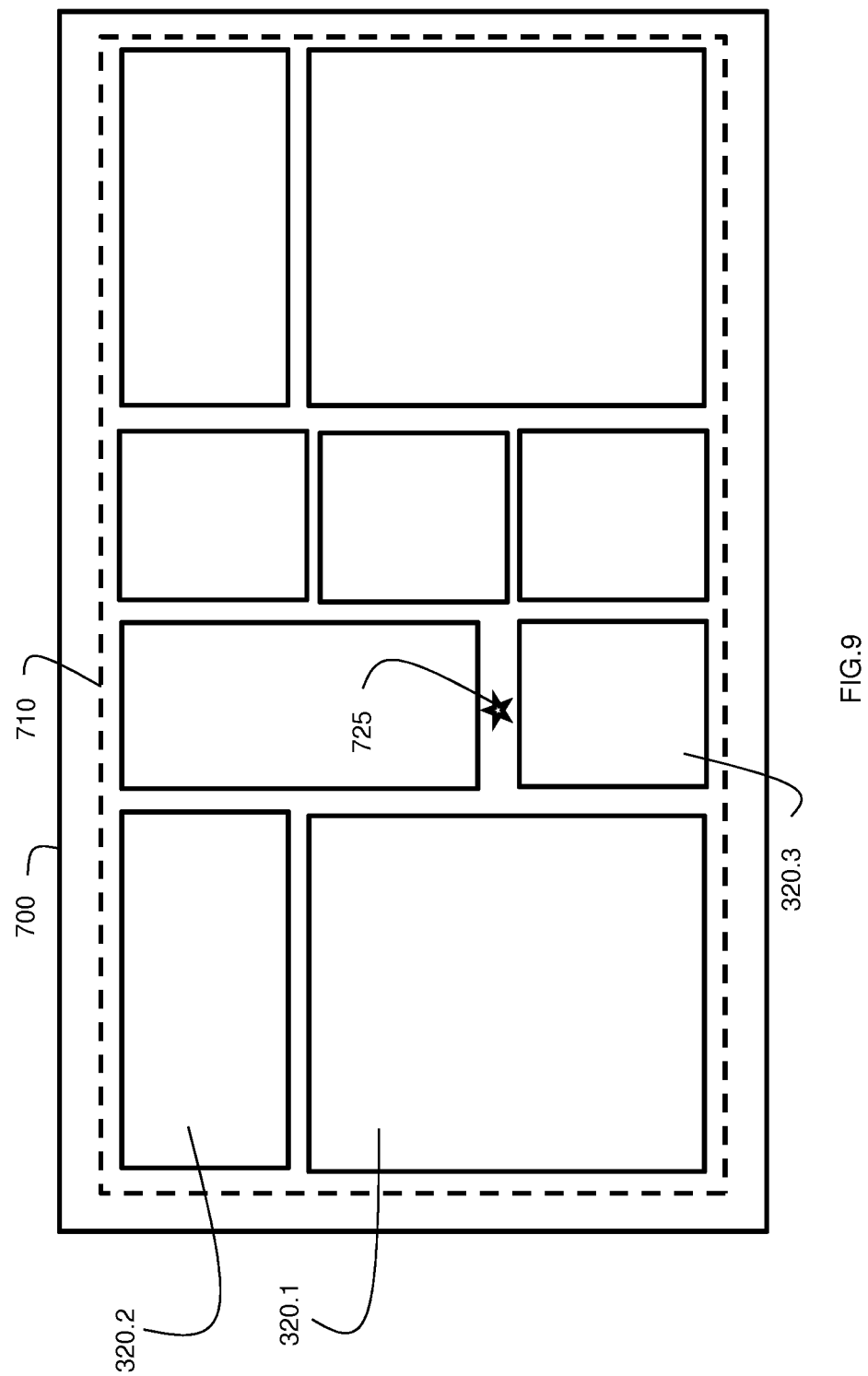
FIG. 9 schematically depicts an alternative utilization of a substrate that includes a defect.

This is illustrated in FIG. 9. FIG. 9 schematically shows the substrate 700, having the defect 725 and the usable patterning area 710. Compared to the combination of patterns as shown in FIG. 7, one can notice that in the combination of patterns as shown in FIG. 9, one of the patterns 320.2 has been arranged with a different orientation, thus enabling the addition of an extra pattern 320.3, compared to the arrangement of FIG. 7.

As a third example, the manufacturing parameter or criterion as applied by the processing system to determine which combination of one or more patterns to apply may be related to the feasibility of separating the different patterns. As will be appreciated by the skilled person, once the substrates have received all the required processing, the substrate has to be cut or diced in order to separate the different patterns or devices. Whether or not the patterns or devices can be easily separated may depend on the layout of the pattern. In this respect, it may be worth mentioning that it may be favourable to cut the substrate over the entire length or width. Further, cutting or dicing tools may only be equipped to cut the substrate along straight lines. As such, the combination of pattern as shown in FIG. 3 may e.g. initially be separated into three substrate parts by cutting the substrate along cutting lines C1 and C2.

Figure 10:
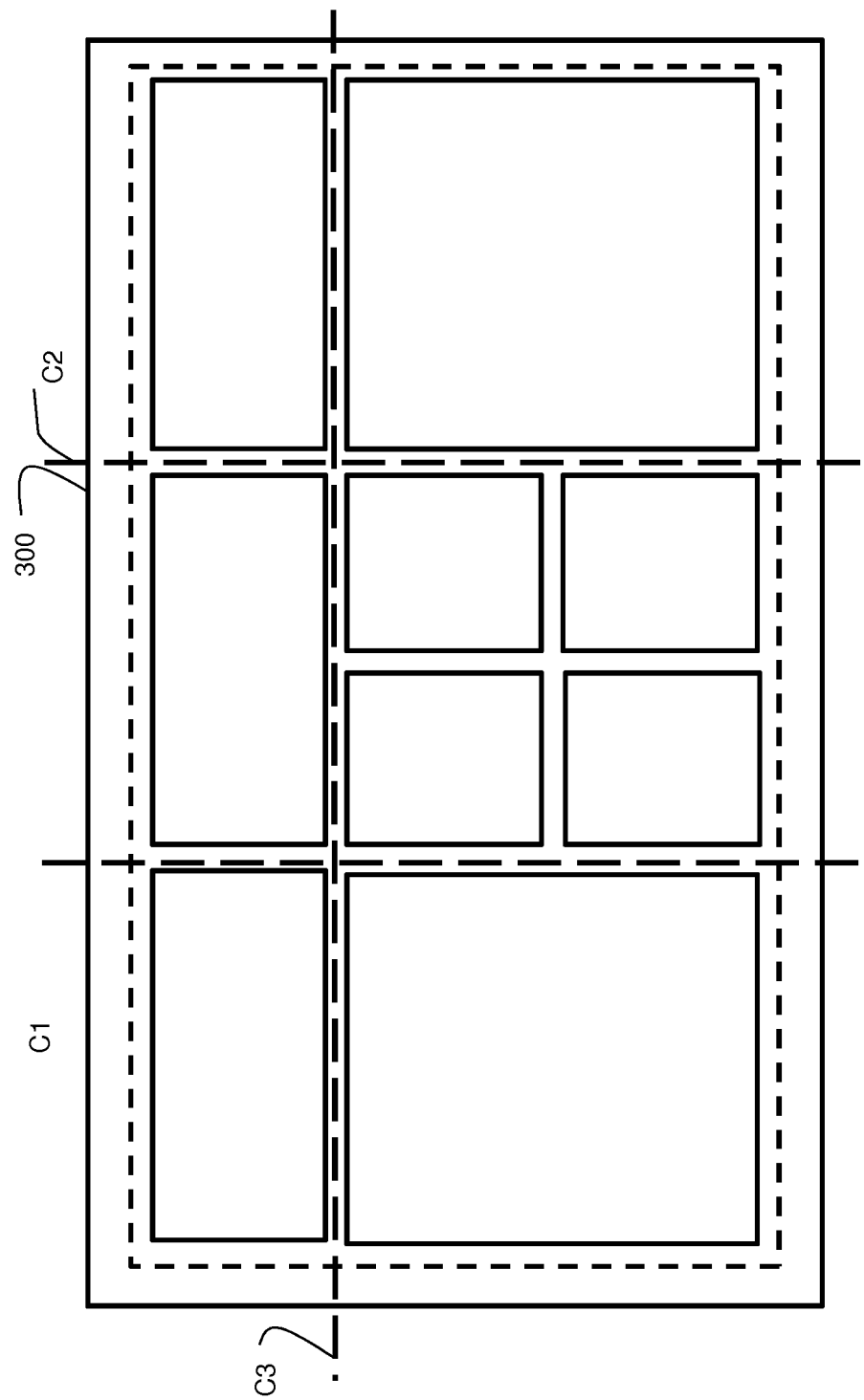
FIG. 10 schematically depicts available cutting lines for the substrate utilization of FIG. 3.

The combination of patterns as shown in FIG. 5 can not be separated in the same manner. As such, depending on the cutting or dicing tool available, or the handling tools available for handling the substrates or substrate parts, the combination of patterns as shown in FIG. 3 may be preferred. As a possible criterion to assess this, the number of available cutting lines that extend over the entire width or length may be worth mentioning. For the combination of patterns as shown in FIG. 3 or 10, three cutting lines are available extending over the entire width (C1 and C2) or the entire length (C3). For the combination of FIG. 5, only two cutting lines would be available extending over the entire width of the substrate.

In an embodiment, the substrate utilization criterion may thus be amended to take the feasibility of the cutting process into account, e.g. by introducing a penalty or penalty function in the criterion in case the available number of cutting lines spanning the entire width or length of the substrate is low.

As described above, the processing system as applied in the lithographic apparatus according to the present invention may be configured to determine, for each individual substrate in a lot of substrates, the most favorable combination of one or more patterns out of N available patterns to be applied. The most favorable combination may be assessed by the processing system by utilizing a criterion based on one or more of a substrate utilization criterion or a manufacturing criterion or parameter. The criterion as applied may e.g. take into account a desired production of the available patterns, the feasibility of cutting or dicing the substrate, the occurrence of defects on the substrate, etc. As will be understood by the skilled person, such an assessment of the most favorable combination of patterns may also be determined for a combination of multiple substrates, e.g. for a lot as a whole. As an example, it may be worth to gather defect information, when available, for an entire lot of substrates. Based on this overall defect information, the processing system may e.g. assess which substrates are not available for the patterning of certain patterns. As will be understood, when a substrate has one or more defects, the options to position comparatively large patterns may be rather limited or non-existent. In the latter case, a required or desired production of devices associated with such comparatively large patterns may thus have to be realized using the defect-free substrates.

In such an embodiment, i.e. where the lithographic apparatus is configured to gather or collect defect information over an entire lot of substrates, the processing system may e.g. be configured to process the defect information and assess whether there are any systematic defects present in the lot of substrates. In particular, when a substantial part of the substrates of a lot of substrates would have a defect in the same location, or in the same region, this could be an indication of a fault in the production or handling of the substrates. In order to assess whether such a fault may have occurred, the processing system may e.g. be configured to generate a defect density map for the lot of substrate, the defect density may be indicating the number of defects per unit or area of the substrate, the substrate e.g. be considered to be subdivided into areas of 5×5 cm and the number of defects per area may be counted.

In such embodiment, the processing system may further be configured, in case the number of defects in a particular area exceeds a predetermined number, to output a warning including an indication of the area where predetermined number of defects has occurred.

In accordance with an embodiment of the present invention, the lithographic apparatus may be equipped with a defect measurement tool for determining whether or not the substrate that needs to be patterned has any defects. Such a measurement tool may e.g. be equipped with a light source for projecting a measurement beam onto the surface of the substrate and a detector to receive reflected or refracted light from the surface. Based on the received light, a processing unit of the measurement tool may then be configured to determine whether or not there is a defect present and the location of the defect.

In such embodiment, the lithographic apparatus may thus be configured to scan the surface of the substrate for defects prior to the patterning process. In case one or more defects have been found, the processing unit of the measurement tool may provide this defect information or data to the processing system of the lithographic apparatus, whereupon the processing system may handle this information as discussed above.

In an embodiment, the present invention provides in a direct write lithographic apparatus, the apparatus being provided with a programmable patterning device. Below, more details of such an apparatus are discussed.

Referring to FIG. 1a, the programmable patterning device 104 as can be applied in a direct write lithographic apparatus according to the present invention comprises a plurality of individually addressable elements 102 to modulate radiation to apply a pattern to beam 110. In an embodiment, the position of the plurality of individually addressable elements 102 can be fixed relative to projection system 108. However, in an alternative arrangement, a plurality of individually addressable elements 102 may be connected to a positioning device (not shown) to accurately position one or more of them in accordance with certain parameters (e.g., with respect to projection system 108).

In an embodiment, the patterning device 104 is a self-emissive contrast device. Such a patterning device 104 obviates the need for a radiation system, which can reduce, for example, cost and size of the lithographic apparatus. For example, the individually addressable elements 102 are radiation emitting diodes, such as light-emitting diodes (LEDs), organic LEDs (OLEDs), polymer LEDs (PLEDs), laser diodes (e.g., solid state laser diodes), vertical external cavity surface emitting lasers (VECSELs), vertical cavity surface emitting lasers (VCSELs), or any combination thereof. In an embodiment, the individually addressable elements 102 are all LEDs. In an embodiment, the individually addressable elements 102 emit radiation having a wavelength in the range of about 380-440 nm, e.g., about 400 or 405 nm. In an embodiment, each of the individually addressable elements 102 can provide an output power selected from the range of 1-100 microwatts ($\mu W$). In an embodiment, each of the individually addressable elements 102 can provide an output current of about 3 microamperes ($\mu A$). In an embodiment, each of the individually addressable elements 102 has an emission cross-sectional width of about 2 micrometers ($\mu m$) or less, e.g., about 1 micrometer or less (for example, assuming 1:1 optics; if using de-magnifying optics, e.g. 2:1 or 4:1, larger emission cross-sectional widths can be used, such as about 8 $\mu m$ or less).

In an embodiment, the self-emissive contrast device comprises more individually addressable elements 102 than needed to allow a "redundant" individually addressable element 102 to be used if another individually addressable element 102 fails to operate or doesn't operate properly. Further, more individually addressable elements 102 than might be needed could be used to have elements 102 work together to deliver a certain power or dose in case individual elements 102 can't provide sufficient optical output alone or to have elements 102 "share the load" by reducing the usage of elements 102 from their maximum or design specification.

The lithographic apparatus 100 comprises an object holder 106. In this embodiment, the object holder comprises an object table 106 to hold a substrate 114 (e.g., a resist-coated silicon wafer or glass substrate). The object table 106 may be movable in up to 6 degrees of freedom (e.g., in at X and/or Y directions) and be connected to a positioning device 116 to accurately position substrate 114 in accordance with certain parameters. For example, a positioning device 116 may accurately position substrate 114 with respect to projection system 108 and/or the patterning device 104. In an embodiment, movement of object table 106 may be realized with the positioning device 116 comprising a long-stroke module (coarse positioning) and optionally a short-stroke module (fine positioning), which are not explicitly depicted in FIG. 1. A similar system may be used to position the individually addressable elements 102, such that, for example, the individually addressable elements 102 can be moved in up to 6 degrees of freedom (e.g., in at X and/or Y directions), e.g., scan in a direction substantially parallel with a scanning direction of the object table 106 and optionally step in an orthogonal direction to the scanning direction. Beam 110 may alternatively/additionally be moveable, while the object table 106 and/or the individually addressable elements 102 may have a fixed position to provide the required relative movement. Such an arrangement may assist in limiting the size of the apparatus.

In an embodiment, which may e.g. be applicable in the manufacture of flat panel displays, the object table 106 may be stationary and positioning device 116 is configured to move substrate 114 relative to (e.g., over) object table 106. For example, the object table 106 may be provided with a system to scan the substrate 114 across it at a substantially constant velocity. Where this is done, object table 106 may be provided with a multitude of openings on a flat uppermost surface, gas being fed through the openings to provide a gas cushion which is capable of supporting substrate 114. This is conventionally referred to as a gas bearing arrangement. Substrate 114 is moved over object table 106 using one or more actuators (not shown), which are capable of accurately positioning substrate 114 with respect to the path of beam 110. Alternatively, substrate 114 may be moved with respect to the object table 106 by selectively starting and stopping the passage of gas through the openings. In an embodiment, the object holder 106 can be a roll system onto which a substrate is rolled and positioning device 116 may be a motor to turn the roll system to provide the substrate onto an object table 106.

Projection system 108 (e.g., a quartz, glass, plastic (e.g., COC) and/or CaF$_2$ lens system or optical element, or a catadioptric system comprising lens elements made from such materials, or a mirror system, or an optical element (e.g., glass element) with an additional layer of polymer, or an optical element comprising a flat surface and a spherical surface, which can be modified to an aspherical surface using, e.g., a polymer layer, etc.) can be used to project the patterned beam modulated by the individually addressable elements 102 onto a target portion 120 (e.g., one or more dies) of substrate 114. Note that, within the meaning of the present invention, a target portion of a substrate refers to a portion of a substrate onto which a pattern is to be projected. As such, a target portion 120 may considered to be a part of the usable patterning area of the substrate, as described above. Projection system 108 may image the pattern provided by the plurality of individually addressable elements 102 such that the pattern is coherently formed on the substrate 114. Alternatively, projection system 108 may project images of secondary sources for which the elements of the plurality of individually addressable elements 102 act as shutters.

In this respect, the projection system may comprise a focusing element, or a plurality of focusing elements (herein referred to generically as a lens array) e.g., a micro-lens array (known as an MLA) or a Fresnel lens array, e.g. to form the secondary sources and to image spots onto the substrate 114. In an embodiment, the lens array (e.g., MLA) comprises at least 10 focusing elements, e.g. at least 100 focusing elements, at least 1,000 focusing elements, at least 10,000 focusing elements, at least 100,000 focusing elements, or at least 1,000,000 focusing elements. In an embodiment, the number of individually addressable elements in the patterning device is equal to or greater than the number of focusing elements in the lens array. In an embodiment, the lens array comprises a plurality of focusing elements, at least one focusing element is optically associated with one or more of the individually addressable elements in the array of individually addressable elements, e.g. with only one of the individually addressable elements in the array of individually addressable elements, or with 2 or more of the individually addressable elements in the array of individually addressable elements, e.g., 3 or more, 5 or more, 10 or more, 20 or more, 25 or more, 35 or more, or 50 or more; in an embodiment, at least one focusing element of the plurality of optical elements is optically associated with less than 5,000 individually addressable elements, e.g. less than 2,500, less than 1,000, less than 500, or less than 100.

In an embodiment, the lens array comprises two or more focusing elements (e.g. more than 1,000, the majority, or about all) that are each optically associated with a plurality of individually addressable elements in a two-dimensional array.

In an embodiment, the patterning device 104 is movable at least in the direction to and away from the substrate, e.g. with the use of one or more actuators. Being able to move the patterning device to and away from the substrate allows, e.g., for focus adjustment without moving the substrate or the lens array (e.g. for local focus adjustments on non-flat substrates).

In an embodiment, the lens array comprises plastic focusing elements (which may be easy to make, e.g. injection molding, and/or affordable), where, for example, the wavelength of the radiation is greater than or equal to about 400 nm (e.g. 405 nm). In an embodiment, the wavelength of the radiation is selected from the range of about 350 nm-500 nm, e.g., the range of about 375-425 nm. In an embodiment, the lens array comprises quartz or glass focusing elements.

In an embodiment, each or a plurality of the focusing elements may be an asymmetrical lens (e.g., having one or more asymmetric surfaces). The asymmetry may be the same for each of the plurality of focusing elements or may be different for one or more focusing elements of a plurality of focusing elements than for one or more different focusing elements of a plurality of focusing elements. An asymmetrical lens may facilitate converting an oval radiation output into a circular projected spot, or vice versa.

In an embodiment, the focusing element has a high numerical aperture (NA) that is arranged to project radiation onto the substrate out of the focal point to obtain a low NA for the system. A higher NA lens may be more economic, prevalent and/or better quality than an available low NA lens. In an embodiment, low NA is less than or equal to 0.3, in an embodiment 0.18, 0.15 or less. Accordingly, a higher NA lens has a NA greater than the design NA for the system, for example, greater than 0.3, greater than 0.18, or greater than 0.15.

While, in an embodiment, the projection system 108 is separate from the patterning device 104, it need not be. The projection system 108 may be integral with the patterning device 108. For example, a lens array block or plate may be attached to (integral with) a patterning device 104. In an embodiment, the lens array may be in the form of individual spatially separated lenslets, each lenslet attached to (integral with) one or more individually addressable elements of the patterning device 104 as discussed in more detail below.

Optionally, the lithographic apparatus may comprise a radiation system to supply radiation (e.g., ultraviolet (UV) radiation) to the plurality of individually addressable elements 102. If the patterning device is a radiation source itself, e.g. a laser diode array or a LED array, the lithographic apparatus may be designed without a radiation system, i.e. without a radiation source other than the patterning device itself, or at least a simplified radiation system.

The radiation system includes an illumination system (illuminator) configured to receive radiation from a radiation source. The illumination system includes one or more of the following elements: a radiation delivery system (e.g., suitable directing mirrors), a radiation conditioning device (e.g., a beam expander), an adjusting device to set the angular intensity distribution of the radiation (generally, at least the outer and/or inner radial extent (commonly referred to as G-outer and G-inner, respectively) of the intensity distribution in a pupil plane of the illuminator can be adjusted), an integrator, and/or a condenser. The illumination system may be used to condition the radiation that will be provided to the individually addressable elements 102 to have a desired uniformity and intensity distribution in its cross-section. The illumination system may be arranged to divide radiation into a plurality of sub-beams that may, for example, each be associated with one or more of the plurality of the individually addressable elements. A two-dimensional diffraction grating may, for example, be used to divide the radiation into sub-beams. In the present description, the terms "beam of radiation" and "radiation beam" encompass, but are not limited to, the situation in which the beam is comprised of a plurality of such sub-beams of radiation.

The radiation system may also include a radiation source (e.g., an excimer laser) to produce the radiation for supply to or by the plurality of individually addressable elements 102. The radiation source and the lithographic apparatus 100 may be separate entities, for example when the radiation source is an excimer laser. In such cases, the radiation source is not considered to form part of the lithographic apparatus 100 and the radiation is passed from the source to the illuminator. In other cases the radiation source may be an integral part of the lithographic apparatus 100, for example when the source is a mercury lamp.

In an embodiment, the radiation source, which in an embodiment may be the plurality of individually addressable elements 102, can provide radiation having a wavelength of at least 5 nm, e.g. at least 10 nm, at least 50 nm, at least 100 nm, at least 150 nm, at least 175 nm, at least 200 nm, at least 250 nm, at least 275 nm, at least 300 nm, at least 325 nm, at least 350 nm, or at least 360 nm. In an embodiment, the radiation has a wavelength of at most 450 nm, e.g. at most 425 nm, at most 375 nm, at most 360 nm, at most 325 nm, at most 275 nm, at most 250 nm, at most 225 nm, at most 200 nm, or at most 175 nm. In an embodiment, the radiation has a wavelength including 436 nm, 405 nm, 365 nm, 355 nm, 248 nm, 193 nm, 157 nm, 126 nm, and/or 13.5 nm. In an embodiment, the radiation includes a wavelength of around 365 nm or around 355 nm. In an embodiment, the radiation includes a broad band of wavelengths, for example encompassing 365 nm, 405 nm and 436 nm. A 355 nm laser source could be used. In an embodiment, the radiation has a wavelength of about 405 nm.

In operation of the lithographic apparatus 100, where the patterning device 104 is not radiation emissive, radiation is incident on the patterning device 104 (e.g., a plurality of individually addressable elements) from a radiation system (illumination system and/or radiation source) and is modulated by the patterning device 104.

Alternatively, in operation of the lithographic apparatus 100, where the patterning device is self-emissive and comprises a plurality of individually addressable elements 102 (e.g., LEDs), the plurality of the individually addressable elements are modulated by a control circuit (not shown) so that each of the individually addressable elements may be turned "ON" or "OFF" according to a desired pattern, where "ON" is a radiation emission state with higher intensity or dose than when "OFF". In an embodiment, "ON" or "OFF" can include varying gray levels.

The patterned beam 110, after having been created by the plurality of individually addressable elements 102, passes through projection system 108, which focuses beam 110 onto a target portion 120 of the substrate 114.

With the aid of positioning device 116 (and optionally a position sensor 134 on a base 136 (e.g., an interferometric measuring device that receives an interferometric beam 138, a linear encoder or a capacitive sensor)), substrate 114 can be moved accurately, e.g., so as to position different target portions 120 in the path of beam 110. Where used, the positioning device for the plurality of individually addressable elements 102 can be used to accurately correct the position of the plurality of individually addressable elements 102 with respect to the path of beam 110, e.g., during a scan.

Although the lithography apparatus 100 according to an embodiment is described herein as being configured to expose a resist on a substrate, the apparatus 100 may be used to project a patterned beam 110 for use in resistless lithography.

The lithographic apparatus 100 may be of a reflective type (e.g. employing reflective individually addressable elements). Alternatively, the apparatus may be of a transmissive type (e.g. employing transmissive individually addressable elements).

The depicted apparatus 100 can be used in one or more modes, such as:

1. In step mode, the individually addressable elements 102 and the substrate 114 are kept essentially stationary, while an entire patterned radiation beam 110 is projected onto a target portion 120 at one go (i.e. a single static exposure). The substrate 114 is then shifted in the X- and/or Y-direction so that a different target portion 120 can be exposed to the patterned radiation beam 110. In step mode, the maximum size of the exposure field limits the size of the target portion 120 imaged in a single static exposure.

2. In scan mode, the individually addressable elements 102 and the substrate 114 are scanned synchronously while a pattern radiation beam 110 is projected onto a target portion 120 (i.e. a single dynamic exposure). The velocity and direction of the substrate relative to the individually addressable elements may be determined by the (de-) magnification and image reversal characteristics of the projection system PS. In scan mode, the maximum size of the exposure field limits the width (in the non-scanning direction) of the target portion in a single dynamic exposure, whereas the length of the scanning motion determines the length (in the scanning direction) of the target portion.

3. In pulse mode, the individually addressable elements 102 are kept essentially stationary and the entire pattern is projected onto a target portion 120 of the substrate 114 using pulsing (e.g., provided by a pulsed radiation source or by pulsing the individually addressable elements). The substrate 114 is moved with an essentially constant speed such that the patterned beam 110 is caused to scan a line across the substrate 114. The pattern provided by the individually addressable elements is updated as required between pulses and the pulses are timed such that successive target portions 120 are exposed at the required locations on the substrate 114. Consequently, patterned beam 110 can scan across the substrate 114 to expose the complete pattern for a strip of the substrate 114. The process is repeated until the complete substrate 114 has been exposed line by line.

4. In continuous scan mode, essentially the same as pulse mode except that the substrate 114 is scanned relative to the modulated beam of radiation B at a substantially constant speed and the pattern on the array of individually addressable elements is updated as the patterned beam 110 scans across the substrate 114 and exposes it. A substantially constant radiation source or a pulsed radiation source, synchronized to the updating of the pattern on the array of individually addressable elements may be used.

Combinations and/or variations on the above described modes of use or entirely different modes of use may also be employed.

Although specific reference may be made in this text to the use of a lithographic apparatus in the manufacture of a specific device or structure (e.g. an integrated circuit or a flat panel display), it should be understood that the lithographic apparatus and lithographic method described herein may have other applications. Applications include, but are not limited to, the manufacture of integrated circuits, integrated optical systems, guidance and detection patterns for magnetic domain memories, flat panel displays, LCDs, OLED displays, thin film magnetic heads, micro-electromechanical devices (MEMS), micro-opto-electromechanical systems (MOEMS), DNA chips, packaging (e.g., flip chip, redistribution, etc.), flexible displays or electronics (which are displays or electronics that may be rollable, bendable like paper and remain free of deformities, conformable, rugged, thin, and/or lightweight, e.g., flexible plastic displays), etc. Also, for instance in a flat panel display, the present apparatus and method may be used to assist in the creation of a variety of layers, e.g. a thin film transistor layer and/or a color filter layer. Thus, a variation of the same apparatus herein could be used in the manufacture of various electronic and other devices or patterns, including, e.g., on flexible substrates, such as plastic or metal foil using e.g. roll-to-roll techniques and/or foil on a glass carrier.

The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (e.g., a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

A flat panel display substrate may be rectangular in shape. A lithographic apparatus designed to expose a substrate of this type may provide an exposure region which covers a full width of the rectangular substrate, or which covers a portion of the width (for example half of the width). The substrate may be scanned underneath the exposure region, while the patterning device synchronously provides the patterned beam. In this way, all or part of the desired pattern is transferred to the substrate. If the exposure region covers the full width of the substrate then exposure may be completed with a single scan. If the exposure region covers, for example, half of the width of the substrate, then the substrate may be moved transversely after the first scan, and a further scan is typically performed to expose the remainder of the substrate.

The term "patterning device", used herein should be broadly interpreted as referring to any device that can be used to modulate the cross-section of a radiation beam such as to create a pattern in (part of) the substrate. It should be noted that the pattern imparted to the radiation beam may not exactly correspond to the desired pattern in the target portion of the substrate, for example if the pattern includes phase-shifting features or so called assist features. Similarly, the pattern eventually generated on the substrate may not correspond to the pattern formed at any one instant by the array of individually addressable elements. This may be the case in an arrangement in which the eventual pattern formed on each part of the substrate is built up over a given period of time or a given number of exposures during which the pattern provided by the array of individually addressable elements and/or the relative position of the substrate changes. Generally, the pattern created on the target portion of the substrate will correspond to a particular functional layer in a device being created in the target portion, e.g., an integrated circuit or a flat panel display (e.g., a color filter layer in a flat panel display or a thin film transistor layer in a flat panel display). Examples of such patterning devices include, e.g., reticles, programmable mirror arrays, laser diode arrays, light emitting diode arrays, grating light valves, and LCD arrays. Patterning devices whose pattern is programmable with the aid of an electronic devices (e.g., a computer), e.g., patterning devices comprising a plurality of programmable elements that can each modulate the intensity of a portion of the radiation beam, (e.g., all the devices mentioned in the previous sentence except for the reticle), including electronically programmable patterning devices having a plurality of programmable elements that impart a pattern to the radiation beam by modulating the phase of a portion of the radiation beam relative to adjacent portions of the radiation beam, are collectively referred to herein as "contrast devices". In an embodiment, the patterning device comprises at least 10 programmable elements, e.g. at least 100, at least 1000, at least 10000, at least 100000, at least 1000000, or at least 10000000 programmable elements. Embodiments of several of these devices are discussed in some more detail below:

A programmable mirror array. The programmable mirror array may comprise a matrix-addressable surface having a viscoelastic control layer and a reflective surface. The basic principle behind such an apparatus is that, for example, addressed areas of the reflective surface reflect incident radiation as diffracted radiation, whereas unaddressed areas reflect incident radiation as undiffracted radiation. Using an appropriate spatial filter, the undiffracted radiation can be filtered out of the reflected beam, leaving only the diffracted radiation to reach the substrate. In this manner, the beam becomes patterned according to the addressing pattern of the matrix-addressable surface. As an alternative, the filter may filter out the diffracted radiation, leaving the undiffracted radiation to reach the substrate. An array of diffractive optical MEMS devices may also be used in a corresponding manner A diffractive optical MEMS device may comprise a plurality of reflective ribbons that may be deformed relative to one another to form a grating that reflects incident radiation as diffracted radiation. A further embodiment of a programmable mirror array employs a matrix arrangement of tiny mirrors, each of which may be individually tilted about an axis by applying a suitable localized electric field, or by employing piezoelectric actuation means. The degree of tilt defines the state of each mirror. The mirrors are controllable, when the element is not defective, by appropriate control signals from the controller. Each non-defective element is controllable to adopt any one of a series of states, so as to adjust the intensity of its corresponding pixel in the projected radiation pattern. Once again, the mirrors are matrix-addressable, such that addressed mirrors reflect an incoming radiation beam in a different direction to unaddressed mirrors; in this manner, the reflected beam may be patterned according to the addressing pattern of the matrix-addressable mirrors. The required matrix addressing may be performed using suitable electronic means. More information on mirror arrays as here referred to can be gleaned, for example, from U.S. Pat. Nos. 5,296,891 and 5,523,193, and PCT Patent Application Publication Nos. WO 98/38597 and WO 98/33096, which are incorporated herein by reference in their entirety.

A programmable LCD array. An example of such a construction is given in U.S. Pat. No. 5,229,872, which is incorporated herein by reference in its entirety.

The lithographic apparatus may comprise one or more patterning devices, e.g. one or more contrast devices. For example, it may have a plurality of arrays of individually addressable elements, each controlled independently of each other. In such an arrangement, some or all of the arrays of individually addressable elements may have at least one of a common illumination system (or part of an illumination system), a common support structure for the arrays of individually addressable elements and/or a common projection system (or part of the projection system).

Where pre-biasing of features, optical proximity correction features, phase variation techniques and/or multiple exposure techniques are used, for example, the pattern "displayed" on the array of individually addressable elements may differ substantially from the pattern eventually transferred to a layer of or on the substrate. Similarly, the pattern eventually generated on the substrate may not correspond to the pattern formed at any one instant on the array of individually addressable elements. This may be the case in an arrangement in which the eventual pattern formed on each part of the substrate is built up over a given period of time or a given number of exposures during which the pattern on the array of individually addressable elements and/or the relative position of the substrate changes.

The projection system and/or illumination system may include various types of optical components, e.g., refractive, reflective, magnetic, electromagnetic, electrostatic or other types of optical components, or any combination thereof, to direct, shape, or control the beam of radiation.

The lithographic apparatus may be of a type having two (e.g., dual stage) or more substrate tables (and/or two or more patterning device tables) or one or more substrate tables in combination with another table not holding a substrate (e.g., a table for cleaning, and/or measurement, etc.). In such "multiple stage" machines the additional table(s) may be used in parallel, or preparatory steps may be carried out on one or more tables while one or more other tables are being used for exposure.

The lithographic apparatus may also be of a type wherein at least a portion of the substrate may be covered by an "immersion liquid" having a relatively high refractive index, e.g. water, so as to fill a space between the projection system and the substrate. An immersion liquid may also be applied to other spaces in the lithographic apparatus, for example, between the patterning device and the projection system. Immersion techniques are used to increase the NA of projection system. The term "immersion" as used herein does not mean that a structure, e.g., a substrate, must be submerged in liquid, but rather only means that liquid is located between the projection system and the substrate during exposure.

Further, the apparatus may be provided with a fluid processing cell to allow interactions between a fluid and irradiated parts of the substrate (e.g., to selectively attach chemicals to the substrate or to selectively modify the surface structure of the substrate).

In an embodiment, the substrate has a substantially circular shape, optionally with a notch and/or a flattened edge along part of its perimeter. In an embodiment, the substrate has a polygonal shape, e.g. a rectangular shape. Embodiments where the substrate has a substantially circular shape include embodiments where the substrate has a diameter of at least 25 mm, for instance at least 50 mm, at least 75 mm, at least 100 mm, at least 125 mm, at least 150 mm, at least 175 mm, at least 200 mm, at least 250 mm, or at least 300 mm. In an embodiment, the substrate has a diameter of at most 500 mm, at most 400 mm, at most 350 mm, at most 300 mm, at most 250 mm, at most 200 mm, at most 150 mm, at most 100 mm, or at most 75 mm. Embodiments where the substrate is polygonal, e.g. rectangular, include embodiments where at least one side, e.g. at least 2 sides or at least 3 sides, of the substrate has a length of at least 5 cm, e.g. at least 25 cm, at least 50 cm, at least 100 cm, at least 150 cm, at least 200 cm, or at least 250 cm. In an embodiment, at least one side of the substrate has a length of at most 1000 cm, e.g. at most 750 cm, at most 500 cm, at most 350 cm, at most 250 cm, at most 150 cm, or at most 75 cm. In an embodiment, the substrate is a rectangular substrate having a length of about 250-350 cm and a width of about 250-300 cm The thickness of the substrate may vary and, to an extent, may depend, e.g., on the substrate material and/or the substrate dimensions. In an embodiment, the thickness is at least 50 µm, for instance at least 100 µm, at least 200 µm, at least 300 µm, at least 400 µm, at least 500 µm, or at least 600 µm. In one embodiment, the thickness of the substrate is at most 5000 µm, for instance at most 3500 µm, at most 2500 µm, at most 1750 µm, at most 1250 µm, at most 1000 µm, at most 800 µm, at most 600 µm, at most 500 µm, at most 400 µm, or at most 300 µm. The substrate referred to herein may be processed, before or after exposure, in for example a track (a tool that typically applies a layer of resist to a substrate and develops the exposed resist). Properties of the substrate may be measured before or after exposure, for example in a metrology tool and/or an inspection tool.

In an embodiment, a resist layer is provided on the substrate. In an embodiment, the substrate is a wafer, for instance a semiconductor wafer. In an embodiment, the wafer material is selected from the group consisting of Si, SiGe, SiGeC, SiC, Ge, GaAs, InP, and InAs. In an embodiment, the wafer is a III/V compound semiconductor wafer. In an embodiment, the wafer is a silicon wafer. In an embodiment, the substrate is a ceramic substrate. In an embodiment, the substrate is a glass substrate. Glass substrates may be useful, e.g., in the manufacture of flat panel displays and liquid crystal display panels. In an embodiment, the substrate is a plastic substrate. In an embodiment, the substrate is transparent (for the naked human eye). In an embodiment, the substrate is colored. In an embodiment, the substrate is absent a color. In an embodiment, the substrate comprises a plastic foil on temporary glass carrier. This can include a coated layer of e.g. polyimide on a glass substrate, which is processed in similar fashion to a glass display, but where the glass is removed after processing using, e.g., a UV laser step, desirably after laminating the remaining foil with a protective plastic foil for increased robustness and ease of handling.

While, in an embodiment, the patterning device 104 is described and/or depicted as being above the substrate 114, it may instead or additionally be located under the substrate 114. Further, in an embodiment, the patterning device 104 and the substrate 114 may be side by side, e.g., the patterning device 104 and substrate 114 extend vertically and the pattern is projected horizontally. In an embodiment, a patterning device 104 is provided to expose at least two opposite sides of a substrate 114. For example, there may be at least two patterning devices 104, at least on each respective opposing side of the substrate 114, to expose those sides. In an embodiment, there may be a single patterning device 104 to project one side of the substrate 114 and appropriate optics (e.g., beam directing mirrors) to project a pattern from the single patterning device 104 onto another side of the substrate 114.

In the description herein, the term "lens" should be understood generally to encompass any refractive, reflective, and/or diffractive optical element that provides the same function as the referenced lens. For example, an imaging lens may be embodied in the form of a conventional refractive lens having optical power, in the form of a Schwarzschild reflective system having optical power, and/or in the form of a zone plate having optical power. Moreover, an imaging lens may comprise non-imaging optics if the resulting effect is to produce a converged beam.

The embodiments may further be described using the following clauses:

1. A direct write exposure apparatus configured to process a plurality of substrates, the apparatus comprising:
    a substrate holder configured to hold a substrate having a usable patterning area;
    a patterning system configured to project different patterns onto the substrate;
    a processing system configured to:
        determine a first combination of one or more patterns, selected from the different patterns, that are to be applied on a first substrate of the plurality of substrates; and
        determine a second combination of one or more patterns, different from the first combination of one or more patterns, that are to be applied on a second, subsequent, substrate of the plurality of substrates.
2. The direct write exposure apparatus according to clause 1, wherein the patterning system is configured to:
    provide radiation modulated according to a desired pattern; and
    project the modulated radiation onto a desired location on the usable patterning area of the substrate.
3. The direct write exposure apparatus according to clause 1 or 2, wherein the plurality of substrates form a lot of substrates.
4. The direct write exposure apparatus according to clause 1, 2 or 3, wherein the patterning processing system comprises:
    a patterning device configured to provide the radiation modulated according to the desired pattern; and
    a projection system configured to project the modulated radiation onto the desired location on the usable patterning area of the substrate
5. The direct write exposure apparatus according to any of the clauses 1 to 4, wherein the processing system is configured to determine the first combination and the second combination using a substrate utilisation criterion.
6. The direct write exposure apparatus according to clause 5, wherein the substrate utilisation criterion comprises an optimisation function based on dimensions of the usable patterning area and dimensions of the different patterns.
7. The direct write exposure apparatus according to clause 6, wherein the substrate utilisation criterion comprises a manufacturing parameter or criterion.
8. The direct write exposure apparatus according to clause 7, wherein the manufacturing parameter or criterion comprises a productivity utilisation criterion indicative of a desired production of the one or more patterns.
9. The direct write exposure apparatus according to clause 7, wherein the manufacturing parameter or criterion is associated with a substrate defect location.
10. The direct write exposure apparatus according to clause 8 or 9, wherein the manufacturing parameter or criterion is applied in the optimisation function as a constraint.
11. A method of configuring a direct write exposure apparatus, the method comprising the steps of:
    receiving dimensions of a usable patterning area of a substrate to be processed by the apparatus;
    receiving dimensions of different patterns available for patterning onto the substrate;
    determining a combination of one or more patterns, selected from the different patterns, that are to be applied onto the substrate, the combination of one or more patterns fitting onto the usable patterning area in a non-overlapping manner;
    wherein the step of determining the combination of one or more patterns uses a substrate utilisation criterion.
12. The method according to clause 11, wherein the substrate utilisation criterion comprises an optimisation function based on the dimensions of the usable patterning area and the dimensions of the different patterns.
13. The method according to clause 11, further comprising the step of:
    receiving a manufacturing parameter;
    and wherein the substrate utilisation criterion comprises the manufacturing parameter.
14. A method of operating a direct write exposure apparatus configured to process a plurality of substrates, the method comprising the steps of:
    performing the method according to any of the clauses 11 to 13;
    controlling the direct write exposure apparatus to expose the substrate with the combination of one or more patterns as determined;
    determining a further, different, combination of one or more patterns that are to be applied onto a subsequent substrate of the plurality of substrates using the substrate utilisation criterion;
    controlling the direct write exposure apparatus to expose the subsequent substrate with the further combination of one or more patterns as determined.
15. The method according to clause 14, when referring to clause 13, wherein the step of determining the further combination is preceded by the step of:
    updating the manufacturing parameter.
16. The method according to clause 15, wherein the manufacturing parameter comprises a productivity utilisation criterion that is associated with a desired production of the one or more patterns as determined.
17. An exposure apparatus comprising:
    a substrate holder configured to hold a substrate having a usable patterning area;

a patterning device configured to provide radiation modulated according to a desired pattern;
a projection system configured to project the modulated radiation onto a desired location on the usable patterning area of the substrate;
the patterning device and projection system being configured to project different patterns onto the substrate;
a processing system configured to process a plurality of substrates by performing, for each of the plurality of substrates, the step of:
determining a combination of one or more patterns, selected from the different patterns, that are to be applied onto the substrate, using a substrate utilisation criterion.

18. The exposure apparatus according to clause 17, wherein the processing system is further configured to perform, for each of the plurality of substrates, the step of:
controlling the exposure apparatus to expose the substrate with the combination of one or more patterns as determined.

19. The exposure apparatus according to clause 17 or 18, wherein the substrate utilisation criterion comprises an optimisation function based on dimensions of the usable patterning area and dimensions of the different patterns.

20. The exposure apparatus according to clause 19, wherein the optimization function comprises a weighted combination of a substrate utilization criterion and a productivity utilisation criterion.

21. The exposure apparatus according to clause 17, wherein the different patterns have different dimensions.

22. The exposure apparatus according to clause 17, wherein the combination of the one or more patterns fits onto the usable patterning area in a non-overlapping manner.

23. The exposure apparatus according to clause 17, wherein the plurality of substrates form a lot of substrates.

While specific embodiments have been described above, it will be appreciated that the invention may be practiced otherwise than as described. For example, an embodiment of the invention may take the form of a computer program containing one or more sequences of machine-readable instructions describing a method as disclosed above, or a data storage medium (e.g. semiconductor memory, magnetic or optical disk) having such a computer program stored therein.

Moreover, although certain embodiments and examples have been described, it will be understood by those skilled in the art that the present invention extends beyond the specifically disclosed embodiments to other alternative embodiments and/or uses of the invention and obvious modifications and equivalents thereof. In addition, while a number of variations of the invention have been shown and described in detail, other modifications, which are within the scope of this invention, will be readily apparent to those of skill in the art based upon this disclosure. For example, it is contemplated that various combination or sub-combinations of the specific features and aspects of the embodiments may be made and still fall within the scope of the invention. Accordingly, it should be understood that various features and aspects of the disclosed embodiments can be combined with or substituted for one another in order to form varying modes of the disclosed invention. In an embodiment, one or more features or aspects disclosed in U.S. patent application publication no. US 2011-0188016 and PCT patent application publication no. WO 2010/032224, the entire contents of U.S. patent application publication no. US 2011-0188016 and PCT patent application publication no. WO 2010/032224 incorporated herein by reference, may be combined with or substituted for one or more features or aspects disclosed herein.

Thus, while various embodiments have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

The invention claimed is:

1. A direct write exposure apparatus configured to process a plurality of substrates, the apparatus comprising:
a substrate holder configured to hold a substrate having a usable patterning area;
a patterning system configured to project different patterns onto the substrate; and
a processing system configured to at least:
select a first set of patterns from a collection of different patterns;
determine a first combination of one or more patterns, from the first set of patterns, that are to be applied on a first substrate of the plurality of substrates of a lot;
select a second set of patterns from the collection of different patterns;
determine a second combination of one or more patterns, different from the first combination of one or more patterns from the second set of patterns, that are to be applied on a second, subsequent, substrate of the plurality of substrates of the same lot; and
output information to the patterning system to enable a modulating device to modulate individual elements of the modulating device to produce the first combination of one or more patterns and the second combination of one or more patterns,
wherein the first and/or second combination has two or more patterns, wherein a first pattern of the two or more patterns has a different area than a second pattern of the two or more patterns, and wherein the first combination has a different spatial arrangement of its one or more patterns than the one or more patterns of the second combination.

2. The direct write exposure apparatus according to claim 1, wherein the patterning system is configured to:
provide radiation modulated according to a desired pattern; and
project the modulated radiation onto a desired location on the usable patterning area of the substrate.

3. The direct write exposure apparatus according to claim 1, wherein the patterning system comprises:
a patterning device configured to provide the radiation modulated according to the desired pattern; and
a projection system configured to project the modulated radiation onto the desired location on the usable patterning area of the substrate.

4. The direct write exposure apparatus according to claim 1, wherein the processing system is configured to determine the first combination and the second combination using a substrate utilization criterion.

5. The direct write exposure apparatus according to claim 4, wherein the substrate utilization criterion comprises an optimization function based on dimensions of the usable patterning area and dimensions of the different patterns.

6. The direct write exposure apparatus according to claim 5, wherein the substrate utilization criterion comprises a manufacturing parameter or criterion.

7. The direct write exposure apparatus according to claim 6, wherein the manufacturing parameter or criterion comprises a productivity utilization criterion indicative of a desired production of the one or more patterns relative an available production of the one or more patterns, or wherein the manufacturing parameter or criterion is associated with a substrate defect location.

8. The direct write exposure apparatus according to claim 7, wherein the manufacturing parameter or criterion is applied in the optimization function as a constraint.

9. The direct write exposure apparatus according to claim 1, wherein the processing system is configured to determine the first combination and/or the second combination based on at least a manufacturing parameter representing a desired production of the one or more patterns relative to an available production of the one or more patterns, representing a substrate defect location, and/or representing a feasibility of physically separating the one or more patterns as produced on the substrate.

10. A method comprising:
receiving dimensions of a usable patterning area of a substrate to be processed by an exposure apparatus;
receiving dimensions of different patterns available for patterning onto the substrate;
determining a plurality of different combinations of one or more patterns, selected from the different patterns, each of the combinations of one or more patterns fitting onto the usable patterning area in a non-overlapping manner, wherein the determining the combinations of one or more patterns uses a substrate utilization criterion; and
selecting a subset of one or more combinations from the plurality of determined combinations for application onto the substrate,
wherein the determining and/or selecting is based on at least a manufacturing parameter representing a desired production of the one or more patterns relative to an available production of the one or more patterns, representing a substrate defect location, and/or representing a feasibility of physically separating the one or more patterns as produced on the substrate with a first cut of the substrate, along a line extending all the way, from one edge part of an outer periphery of the substrate to an opposite edge part of the outer periphery of the substrate.

11. The method according to claim 10, wherein the substrate utilization criterion comprises an optimization function based on the dimensions of the usable patterning area and the dimensions of the different patterns.

12. A method of operating a direct write exposure apparatus configured to process a plurality of substrates, the method comprising:
performing the method according to claim 10;
controlling the direct write exposure apparatus to expose the substrate with the combination of one or more patterns as determined;
determining a further, different, combination of one or more patterns that are to be applied onto a subsequent substrate of the plurality of substrates using the substrate utilization criterion; and
controlling the direct write exposure apparatus to expose the subsequent substrate with the further combination of one or more patterns as determined.

13. An exposure apparatus comprising:
a substrate holder configured to hold a substrate having a usable patterning area;
a patterning device configured to provide radiation modulated according to a desired pattern;
a projection system configured to project the modulated radiation onto a desired location on the usable patterning area of the substrate, wherein the patterning device and projection system are configured to project different patterns onto the substrate; and
a processing system configured to process a plurality of substrates by performance, for each of the plurality of substrates, of a:
determination of a plurality of different combinations of one or more patterns, selected from the different patterns, using a substrate utilization criterion, and
selection of a subset of one or more combinations from the plurality of determined combinations for application onto the substrate,
wherein the determination and/or selection is based on at least a manufacturing parameter representing a desired production of the one or more patterns relative to an available production of the one or more patterns, representing a substrate defect location, and/or representing a feasibility of physically separating the one or more patterns as produced on the substrate with a first cut of the substrate, along a line extending all the way, from one edge part of an outer periphery of the substrate to an opposite edge part of the outer periphery of the substrate.

14. The exposure apparatus according to claim 13, wherein the processing system is further configured to perform, for each of the plurality of substrates, control of the exposure apparatus to expose each of the substrates with the respective subset of one or more combinations of one or more patterns as selected for the respective substrate.

15. The exposure apparatus according to claim 13, wherein the substrate utilization criterion comprises an optimization function based on dimensions of the usable patterning area and dimensions of the different patterns.

16. The exposure apparatus according to claim 15, wherein the optimization function comprises a weighted combination of the substrate utilization criterion and the manufacturing parameter.

17. The exposure apparatus according to claim 13, wherein the different patterns have different dimensions.

18. The exposure apparatus according to claim 13, wherein the combination of the one or more patterns fits onto the usable patterning area in a non-overlapping manner.

19. The exposure apparatus according to claim 13, wherein the plurality of substrates form a lot of substrates.

20. The exposure apparatus according to claim 13, wherein the processing system is configured to:
cause the exposure apparatus to apply a first combination of one or more patterns from the subset on a first substrate of the plurality of substrates of a lot; and
cause the exposure apparatus to apply a second different combination of one or more patterns from the subset on a second, subsequent, substrate of the plurality of substrates of the same lot.

* * * * *